(12) United States Patent
Shlomo

(10) Patent No.: US 11,671,083 B2
(45) Date of Patent: Jun. 6, 2023

(54) VOLTAGE-GLITCH DETECTION AND PROTECTION CIRCUIT FOR SECURE MEMORY DEVICES

(71) Applicant: Infineon Technologies LLC, San Jose, CA (US)

(72) Inventor: Oren Shlomo, Haifa (IL)

(73) Assignee: INFINEON TECHNOLOGIES LLC, San Jose, CA (US)

( * ) Notice: Subject to any disclaimer, the term of this patent is extended or adjusted under 35 U.S.C. 154(b) by 0 days.

(21) Appl. No.: 17/241,447

(22) Filed: Apr. 27, 2021

(65) Prior Publication Data
US 2022/0014180 A1    Jan. 13, 2022

Related U.S. Application Data

(60) Provisional application No. 63/048,975, filed on Jul. 7, 2020.

(51) Int. Cl.
*H03K 5/1252* (2006.01)
*H03K 5/153* (2006.01)
(Continued)

(52) U.S. Cl.
CPC ........... *H03K 5/1252* (2013.01); *G01K 7/183* (2013.01); *G01K 7/20* (2013.01); *G01R 19/2506* (2013.01); *G05F 1/648* (2013.01); *G11C 7/02* (2013.01); *G11C 7/1039* (2013.01); *G11C 7/14* (2013.01); *G11C 7/20* (2013.01); *H03K 5/153* (2013.01);
(Continued)

(58) Field of Classification Search
CPC ........ H03K 5/1252; H03K 5/153; H03K 5/19; H03K 5/2472; H03K 17/223; H03K 17/24; G01K 7/183; G01K 7/20; G01R 19/2506; G01R 19/2509; G05F 1/648; G11C 7/02; G11C 7/1039; G11C 7/14; G11C 7/20;
(Continued)

(56) References Cited

U.S. PATENT DOCUMENTS 9,984,763 B1 *   5/2018  Vilas Boas ............ H03K 5/159
2003/0014620 A1   1/2003  Hanjani
(Continued)

OTHER PUBLICATIONS

WIPO Examiner, Search Report and Written Opinion—PCT/2021/040060, dated Oct. 5, 2021.

*Primary Examiner* — John W Poos
*Assistant Examiner* — Tyler J Pereny

(57) ABSTRACT

A voltage-glitch detection and protection circuit and method are provided. Generally, circuit includes a voltage-glitch-detection-block (GDB) and a system-reset-block coupled to the GDB to generate a reset-signal to cause devices in a chip including the circuit to be reset when a voltage-glitch in a supply voltage (VDD) is detected. The GDB includes a voltage-glitch-detector coupled to a latch. The voltage-glitch-detector detects the voltage-glitch and generates a PULSE to the system-reset-block and latch. The latch receives the PULSE and generates a PULSE_LATCHED signal to the system-reset-block to ensure the reset-signal is generated no matter a width of the PULSE. In one embodiment, the latch includes a filter and a sample and hold circuit to power the latch, and ensure the PULSE_LATCHED signal is coupled to the system-reset-block when a voltage to the GDB or to the latch drops below a minimum voltage due to the voltage-glitch.

15 Claims, 17 Drawing Sheets

(51) Int. Cl.

| | |
|---|---|
| *G11C 7/20* | (2006.01) |
| *G11C 7/02* | (2006.01) |
| *H03K 17/22* | (2006.01) |
| *G01K 7/18* | (2006.01) |
| *G01K 7/20* | (2006.01) |
| *G01R 19/25* | (2006.01) |
| *G11C 7/14* | (2006.01) |
| *H03K 5/24* | (2006.01) |
| *G11C 7/10* | (2006.01) |
| *H03K 5/19* | (2006.01) |
| *H03K 17/24* | (2006.01) |
| *G05F 1/648* | (2006.01) |

(52) U.S. Cl.
CPC ............ *H03K 5/19* (2013.01); *H03K 5/2472* (2013.01); *H03K 17/223* (2013.01); *H03K 17/24* (2013.01)

(58) Field of Classification Search
CPC ........... G11C 5/148; G11C 7/24; G11C 16/22; G11C 16/30
See application file for complete search history.

(56) References Cited

U.S. PATENT DOCUMENTS

| | | | |
|---|---|---|---|
| 2007/0257655 A1* | 11/2007 | Nguyen | ................ G05F 3/30 323/314 |
| 2008/0061843 A1* | 3/2008 | Yanci | ................ H03K 5/153 327/78 |
| 2012/0092046 A1 | 4/2012 | Li et al. | |
| 2014/0091780 A1* | 4/2014 | Hu | ................ G05F 1/462 323/314 |
| 2015/0015283 A1 | 1/2015 | Park et al. | |
| 2016/0012919 A1 | 1/2016 | Bouzekri | |
| 2016/0105169 A1 | 4/2016 | Lou | |
| 2016/0261264 A1 | 9/2016 | Mai | |
| 2017/0184688 A1* | 6/2017 | Nakamura | ............. G01R 33/07 |

* cited by examiner

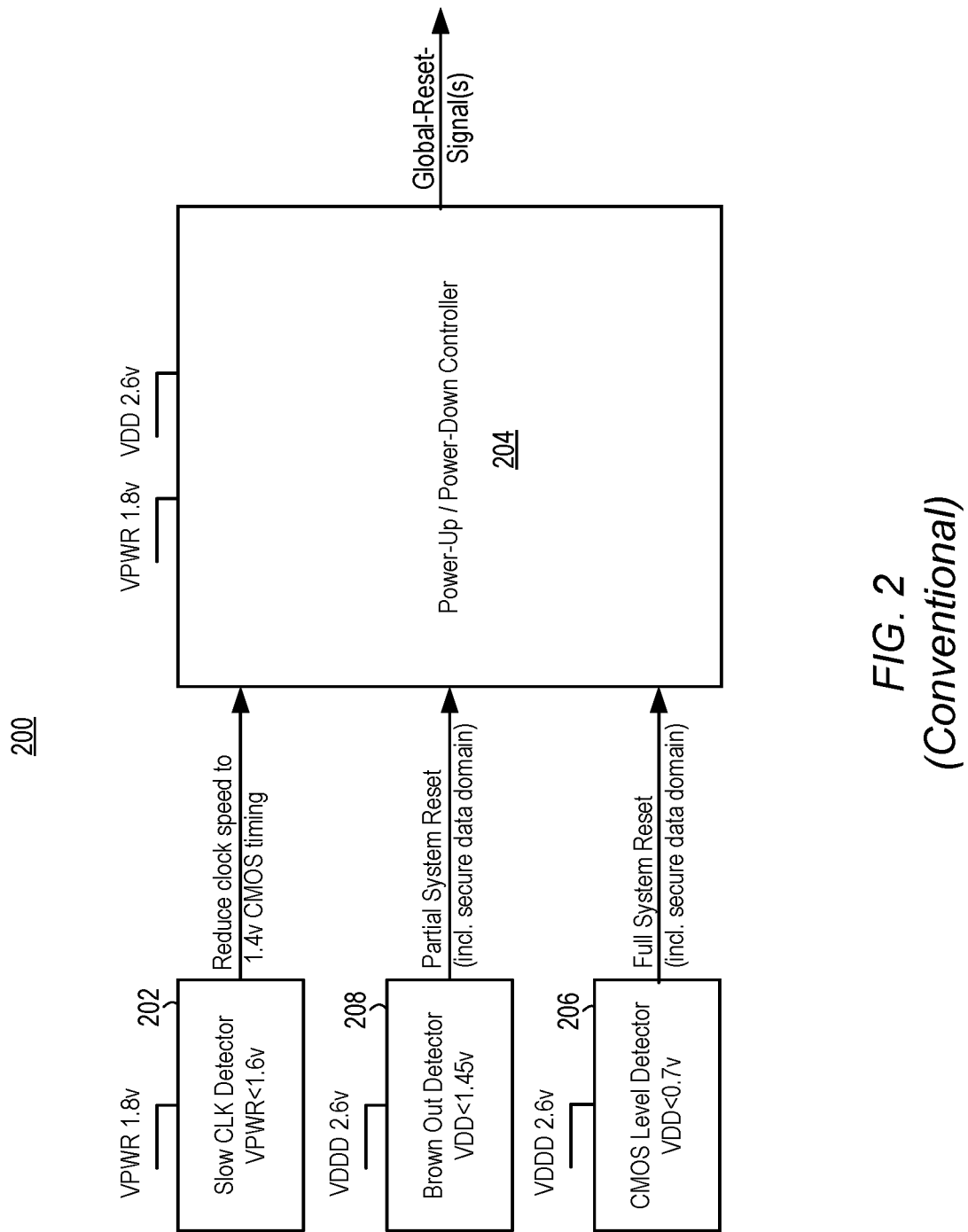
FIG. 2
(Conventional)

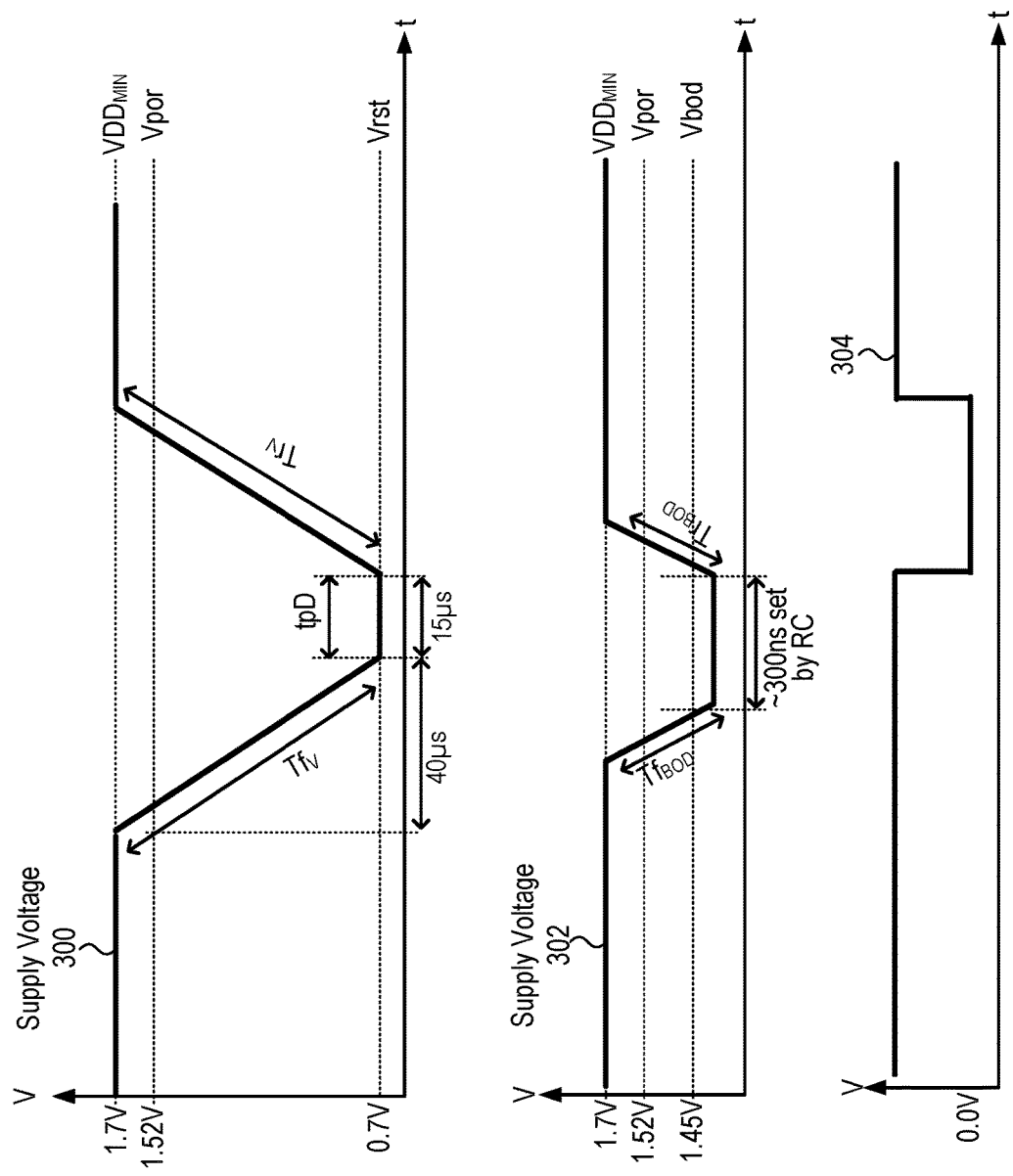
FIG. 3
(Conventional)

VOLTAGE-GLITCH DETECTION AND PROTECTION CIRCUIT FOR SECURE MEMORY DEVICES

CROSS-REFERENCE TO RELATED APPLICATIONS

This application is claims the benefit of priority under 35 U.S.C. 119(e) to U.S. Provisional Patent Application Ser. No. 63/048,975, filed Jul. 7, 2020, which is incorporated by reference herein in its entirety.

TECHNICAL FIELD

This disclosure relates generally to secure memory devices, and more particularly to voltage-glitch-detectors and methods for operating the same to detect and protect against a side channel voltage-glitch attack in a secure memory device.

BACKGROUND

FIG. 1 is a schematic block diagram illustrating a side channel voltage-glitch attack (SCA) on a secure chip 100. Referring to FIG. 1, in a SCA, hackers use external hardware 102 to cause a voltage-glitch 104 on the chip's supply voltage 106 to cause the analog and/or digital circuits and elements on chip to operate in unstable or under abnormal conditions, which can enable the attacker to access confidential data, such as encryption keys, etc., stored in a memory 108 of the secured chip. By voltage-glitch it is meant a very fast, very brief lowering of the supply voltage from standard complementary-metal-on-silicon (CMOS) voltage levels to 0V or to a negative voltage, followed by a similarly rapid return to the supply voltage. As shown in FIG. 1 the voltage-glitch 104 can cause the output voltage from the supply voltage 106 to drop, for example, from a standard CMOS voltage ($V_{STD}$) to below a minimum CMOS voltage ($VDD_{MIN}$) for a time as brief as about 20 ns. SCA have become an important issue for many secure systems, and in particular for those including secure chips 100 with secure non-volatile or flash memory.

Existing secure chips or systems with memory typically include a conventional reset circuit 200 including one or more blocks or circuits to detect different events or changes in a supply voltage or power. For example, the reset circuit 200 shown in FIG. 2 includes a slow-clock voltage-detector (Slow CLK detector 202), a CMOS level-detector 206 and includes a brown out-detector (BOD 208). The Slow CLK-detector 202 is designed to detect a drop in a first supply voltage (VPWR) and signal a power-up/power-down (PU/PD) controller 204 to reduce clock speed to CMOS devices to compensate. The CMOS level-detector 206 detects larger decreases in a second (main) supply voltage (VDD) occurring at first rate or slope and signals the PU/PD controller 204 to perform a full system reset of all analog and digital devices on a secure chip or in a secure system in which the reset circuit 200 is used. The primary purpose of CMOS level-detector 206 is to signal the PU/PD controller 204 that the supply voltage is above CMOS levels. The CMOS level detector is implemented in a way that enables it to initiate a full system reset when the supply voltage drops for about 15 μsec below CMOS levels. The primary purpose of CMOS level-detector 206 is to signal the PU/PD controller 204 that the supply voltage is above CMOS levels, but this does not indicate the voltage is high enough to meet full functionality or performance, thus the more accurate BOD is used for that purpose. The BOD 208 is designed to detect smaller voltage drops in the VDD, occurring at lower durations and higher voltage slopes than the CMOS level-detector 206 and signal the PU/PD controller 204 to perform a partial system reset of analog and digital devices on the chip, including at least some devices in a secure data domain, such as at least some on chip memories. Both the CMOS level-detector 206 and the BOD 208 require a longer than 300 ns power down time (tpD) at or below a trip-point of the CMOS level-detector or the BOD before initiating a reset. Thus, both the CMOS level-detector 206, and the BOD 208, typically have a relatively slow response, too long to detect a 20 ns glitch of a fast SCA.

Additionally, both the CMOS level-detector 206 and the BOD 208 are typically integrally formed in the same circuit as other devices on the secure chip and experience the same drop in supply voltages, and thus may become inoperative or at least unreliable under extreme and/or rapid changes in voltage, such as an extreme, rapid negative voltage-glitch or pulse of an SCA. Because the CMOS level-detector 206 and the BOD 208 cannot reliably operate under the voltage conditions of a voltage-glitch event they fail to detect SCAs. This is especially problematic for CMOS level-detector 206 and the BOD 208 made using CMOS devices, which are unable to operate at sub-CMOS and/or negative voltage.

FIG. 3 shows timing diagrams of typical voltages and signals in a conventional power reset scheme using CMOS level-detectors and BOD. In particular, line 300 in the top diagram represents a drop in supply voltage that would be detected by a conventional CMOS level-detector, which would then trigger a RESET_PULSE 304. Line 302 in the middle diagram represents a separate event, i.e., a drop in supply voltage, that is both faster and a lesser drop in supply voltage than can be detected by a conventional CMOS level-detector, but that would be detected by a conventional brown-out-detector (BOD), which would then trigger the RESET_PULSE 304 resulting in a safe reset of all circuits and elements on the chip.

Referring again to the top diagram in FIG. 3 it is noted that the conventional CMOS level-detector is capable of detecting a drop in supply voltage down to a reset supply voltage ($V_{rst}$) of from about 1.1V to about 0.7V at a fall slope ($Tf_V$) of about 40 μsec/1V, and will trigger the RESET_PULSE after a tpD much longer than 0.05 μs (50 ns). It is further noted that the RESET_PULSE 304 is not de-asserted until after a further time required for the supply voltage to recover to a power-on-reset voltage (Vpor) of about 1.52V.

Similarly, as shown in the middle diagram of FIG. 3 a conventional BOD is capable of detecting a smaller drop in supply voltage down to a brown out supply voltage trip level ($V_{bod}$) of about 1.45V at a sharper or higher falling slope ($Tf_{BOD}$). The power down time (tpD) required for the BOD is generally set by a native response time of a comparator in the BOD, typically 50 ns-100 ns, plus a charge time of an additional RC circuit in the BOD, which, for example, sums up to about 300 ns.

Accordingly, there is a need for a voltage-glitch detection and protection system or circuit and method for detecting and protecting against a side channel voltage-glitch attack in a secure memory device. It is further desirable that the circuit and method not interfere with existing CMOS level-detectors or BODs, or otherwise adversely impact operation of the secure chip or memory device in which it is included or used.

SUMMARY

A voltage-glitch detection and protection circuit and method for protecting against a voltage-glitch are provided.

Generally, the circuit includes a voltage-glitch-detection-block and a system-reset-block coupled to the voltage-glitch-detection-block to generate a system-reset-signal to cause a number of on-chip-circuits or sub-circuits and devices in a chip including the voltage-glitch detection and protection circuit to be reset when a voltage-glitch in a supply voltage (VDD) is detected. The voltage-glitch-detection-block includes a voltage-glitch-detector coupled to a latch. The voltage-glitch-detector detects the voltage-glitch and generates and couples a voltage-glitch-detection-pulse (PULSE) to the system-reset-block and to the latch. The latch receives the PULSE and generates and couples a voltage-glitch-detection-pulse-latched (PULSE_LATCHED) signal to the system-reset-block to ensure the system-reset-signal is generated no matter a width of the PULSE. In one embodiment, the latch is a voltage-glitch-isolated latch and includes a voltage-glitch-isolation filter to supply a filtered VDD voltage ($VDD_{RC}$) to the latch, and further a sample and hold of the $VDD_{RC}$ supply ($VDD_{RC-S\&H}$) provides power to the latch, and ensure the PULSE_LATCHED signal is coupled to the system-reset-block when VDD to the latch and/or the voltage-glitch-detection-block or drops below a minimum voltage due to the voltage-glitch.

In another aspect a method is provided for operating a voltage-glitch detection and protection circuit to protect against a voltage-glitch in a secure chip. Generally, the method begins with comparing a supply voltage (VDD) coupled to a first input of a comparator in a voltage-glitch-detection-block to a reference voltage ($V_{REF}$) based on a predetermined set-point voltage ($V_{GLITCH}$) coupled to a second input of the comparator. If the supply voltage is less than the reference voltage (VDD<$V_{REF}$), a voltage-glitch-detection-pulse (PULSE) is generated and coupled to a latch in the voltage-glitch-detection-block and to a system reset block. Next, a voltage-glitch-detection-pulse-latched (PULSE_LATCHED) signal is generated and coupled to the system reset block. The system reset block receives the PULSE and/or the PULSE_LATCHED signal and generates a secure system reset signal causing sub-circuits and devices in the chip to be fully and safely reset. Because the latch generates and couples a separate PULSE_LATCHED signal to the system reset block, the system-reset-signal is generated no matter a width of the PULSE. In one embodiment, the method further includes filtering, sampling and holding a voltage to the latch to ensure the PULSE_LATCHED signal is coupled to the system-reset-block when the voltage to the latch and/or the voltage-glitch-detection-block drops below a minimum voltage due to the voltage-glitch.

The voltage-glitch detection and protection circuit and method are particularly useful for protecting a secure chip including an embedded non-volatile memory (eNVM) or flash memory against side channel voltage-glitch attack (SCA).

Further features and advantages of embodiments of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to a person skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts. Further, the accompanying drawings, which are incorporated herein and form part of the specification, illustrate embodiments of the present invention, and, together with the description, further serve to explain the principles of the invention and to enable a person skilled in the relevant art(s) to make and use the invention.

FIG. 2 is a block diagram of a conventional circuit for detecting changes in a supply voltage;

FIG. 3 are timing diagrams showing typical voltages and signals in a conventional power reset scheme;

DETAILED DESCRIPTION

A voltage-glitch detection and protection circuit and method for detecting and protecting against a side channel voltage-glitch attack or side channel attack (SCA) are disclosed.

In the following description, for purposes of explanation, numerous specific details are set forth in order to provide a thorough understanding of the present invention. It will be evident, however, to one skilled in the art that the present invention may be practiced without these specific details. In other instances, well-known structures, and techniques are not shown in detail or are shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment. The term to couple as used herein may include both to directly electrically connect two or more components or elements and to indirectly connect through one or more intervening components.

Embodiments of a power-reset or voltage-glitch detection and protection circuit or system including a voltage-glitch-detection-block to detect a glitch, such as used in a SCA, will now be described with reference to FIGS. 4 through 7. By glitch it is meant a very brief and rapid, lowering of a main supply voltage (VDD) from a standard voltage levels to 0V or even to a negative voltage, that may be followed by a similarly rapid return to the supply voltage or a much slower return to the supply voltage. Voltage glitches used in SCA can last for a time as brief as about 20 ns or last more than several micro seconds.

Figure 1:
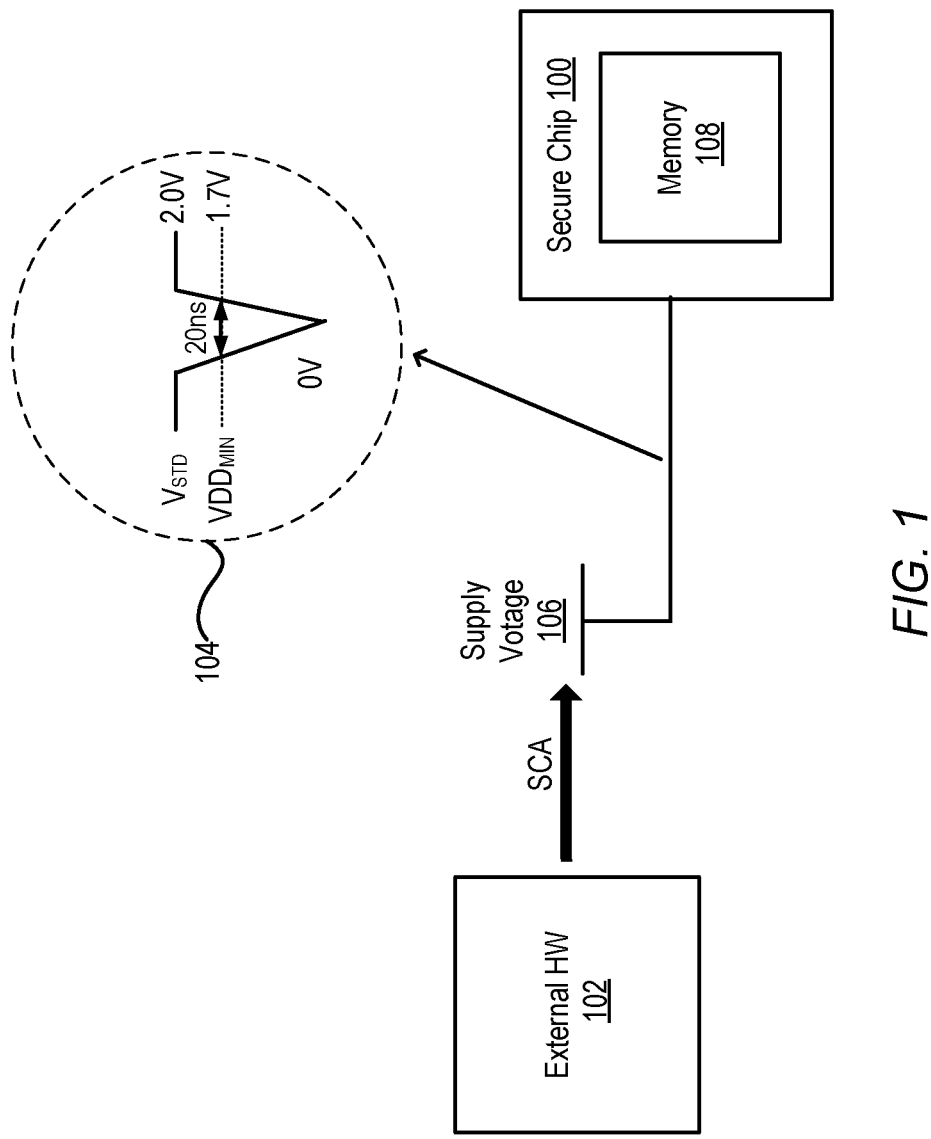
FIG. 1 is a block diagram illustrating a side channel voltage-glitch attack (SCA) on a secure chip.
Figure 4:
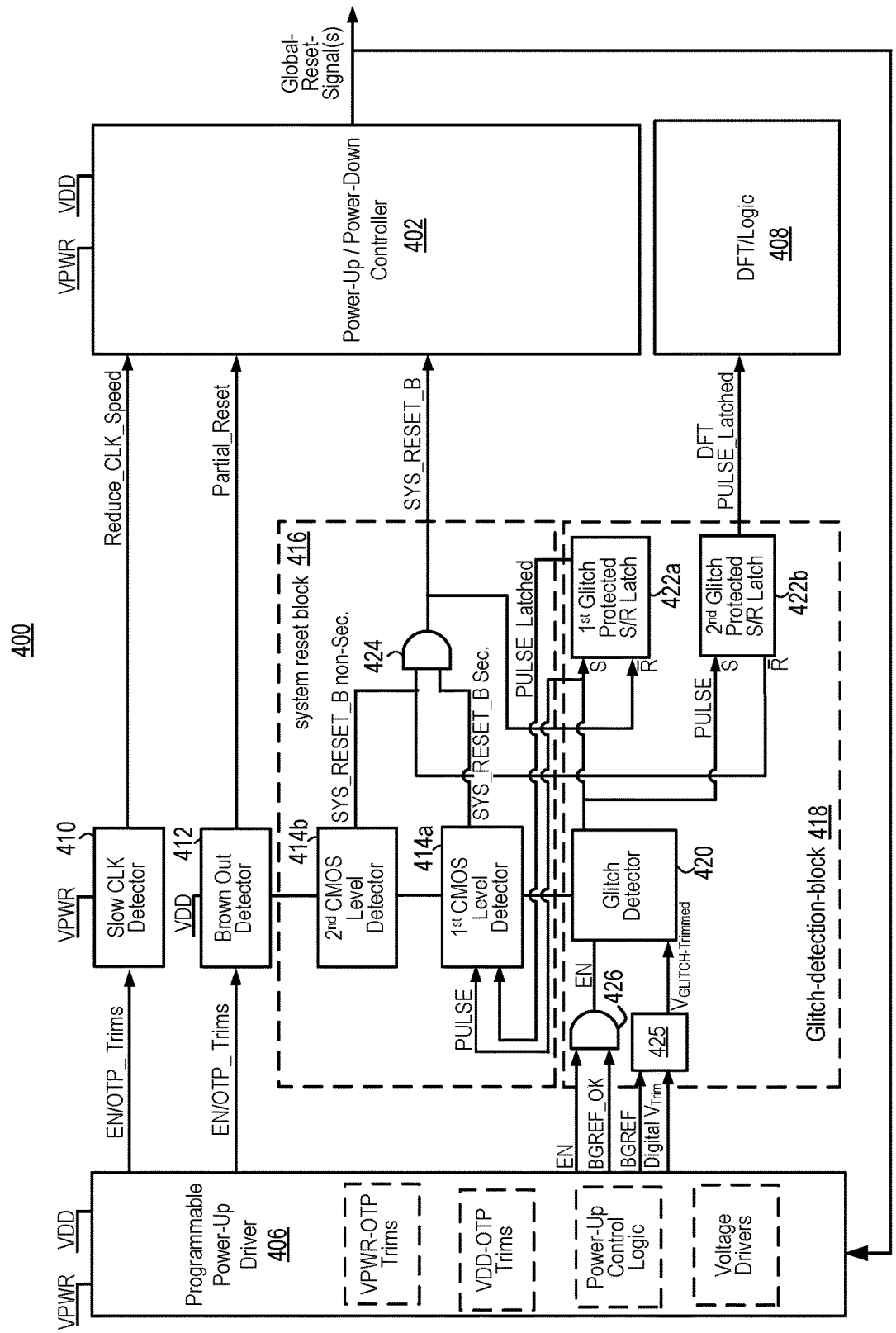
FIG. 4 is a block diagram illustrating an embodiment of a voltage-glitch detection and protection circuit including a voltage-glitch-detection-block.

In particular, FIG. 4 is a block diagram illustrating an embodiment of a voltage-glitch detection and protection circuit 400 including a voltage-glitch-detection-block. Referring to FIG. 4, in one embodiment the voltage-glitch detection and protection circuit 400 includes a power-up/power-down (PU/PD) controller 402 or block, a number of reset-detectors, and a programmable power-up driver 406, which includes power-up control logic, voltage drivers and one time programmable (OTP) trims. Optionally, the glitch detection and protection circuit 400 further includes design-for-testability logic (DFT/Logic 408). The number of reset-detectors can include a slow clock voltage-detector (Slow CLK detector 410) coupled to a first voltage supply (VPWR), a brown out-detector (BOD 412), one or more CMOS level-detectors 414a, 414b in a system reset block 416, and, in accordance with the present disclosure, a voltage-glitch-detection-block 418 including a voltage-glitch-detector 420 and a number of latches or voltage-glitch-protected-latches, such as voltage-glitch protected set/reset (S/R) latches 422a, 422b.

The PU/PD controller 402 receives a system reset signal from number of reset-detectors and generates one or more global-reset-signals to analog and digital or logical devices and other circuits on a secure chip (not shown in this figure) to power up the devices and circuits in a predefined power-on-reset (POR) sequence. Preferably, the POR sequence of the chip is the same regardless of the event which causes the reset to ensure the device or secure chip in which the voltage-glitch detection and protection circuit 400 is embodied or included, thereby ensuring confidential data, such as encryption keys, etc., is secured.

The programmable power-up driver 406 includes a number of one-time-programmable (OTP) memory elements, logic elements and voltage drivers powered by one or more main voltage supplies, including a first voltage supply (VPWR) and the second, or main voltage supply (VDD). The programmable power-up driver 406 is configured to receive one or more global-reset-signals from the PU/PD controller 402 and, on power-up, to send a number of enable signals, voltage-trim signals and reference signals to the reset-detectors.

The slow-Clk voltage-detector 410 is coupled to VPWR to monitor a VPWR voltage. The slow-Clk voltage-detector 410 receives enable and OTP voltage-trim signals from the programmable power-up driver 406 and is configured to detect a drop in VPWR from a first CMOS voltage, for example 1.8V, to a second CMOS voltage, for example 1.6V, and signal the PU/PD controller 402 to reduce clock speed to devices and circuits on the secure chip in which the voltage-glitch detection and protection circuit 400 is embodied or included to compensate for CMOS speed degradation at voltages lower than a predetermined minimum user voltage ($VDD_{MIN}$).

The brown out-detector or BOD 412 is coupled to the second main voltage supply (VDD) both for power and to monitor the VDD voltage. The BOD 412 receives enable and OTP voltage-trim signals from the programmable power-up driver 406, and generally uses comparator sensors, which can require couple of hundreds of nanoseconds down time at or below a trip-point voltage ($V_{BOD}$) of the BOD before initiating a reset. The BOD 412 is designed or configured to detect smaller voltage drops in VDD, occurring at lower durations and higher voltage slopes than the CMOS level-detectors 414a, 414b, and to signal the PU/PD controller 402 to perform a partial system reset of analog and digital devices on the chip, including at least some devices in a secure data domain, such as at least some on chip memories.

In the embodiment shown, the first CMOS level-detector 414a is coupled between the voltage-glitch-detection-block 418 and the PU/PD controller 402, and the second CMOS level-detector 414b is coupled to the PU/PD controller. The CMOS level-detectors 414a, 414b, are also coupled to VDD both for power and to monitor a VDD voltage, and include sensors configured to detect/sense a drop in VDD at a rate or slope, which is a much lower than a slope that the BOD 412 is configured to detect/sense.

In the embodiment shown, the system reset block 416 further includes a first logic gate 424 through which both complements of a secure system reset signal, (SYS_RESET_B Sec.) from the first CMOS level-detector 414a and a non-secure system reset signal (SYS_RESET_B non-Sec.) from the second CMOS level detector 414b are coupled to the PU/PD controller 402 to cause the PU/PD controller to execute a full reset of the secure chip.

The first and second CMOS level-detectors 414a, 414b, are similar in configuration and function in respect to slow VDD supply changes detection, but are not identical in respect to their behavior during a detection of a voltage-glitch. In particular, as shown in FIG. 4 the first CMOS level-detector 414a is configured to receive both a voltage-glitch detection pulse (PULSE) and a voltage-glitch pulse latched (PULSE_LATCHED) signal from the voltage-glitch-detection-block 418, to generate a SYS_RESET_B Sec. signal in response thereto, and to couple the SYS_RESET_B Sec. signal to the PU/PD controller 402 through the first logic gate 424. Additionally, as explained in greater detail below, in some embodiments the first CMOS level-detector 414a is used as a retention or memory circuit to enable the storing and recall of a voltage-glitch detection event following loss of power to the system reset block 416 upon restoration of power.

The voltage-glitch-detection-block 418 includes in addition to the glitch-detector 420 and at least a first voltage-glitch protected S/R latch 422a. The first voltage-glitch protected S/R latch 422a has a set (S) input coupled to the voltage-glitch-detector 420 to receive the PULSE therefrom, an output connected to the first CMOS level-detector 414a to couple the PULSE_LATCHED signal thereto, and a reset_b ($\overline{R}$) input coupled to an output of the first logic gate 424 to reset the first voltage-glitch protected S/R latch once the SYS_RESET_B signal is coupled to the PU/PD controller 402.

Where included, as in the embodiment shown, the glitch-detection-block 418 further includes a second voltage-glitch protected S/R latch 422b having a set (S) input coupled to the voltage-glitch-detector 420 to receive the PULSE, an output coupled to the (DFT)/Logic 408, and a reset_b ($\overline{R}$) input coupled to an output of the second CMOS level-detector 414b to reset the second voltage-glitch protected S/R latch only if a full VDD supply power-down reset was performed. This second instantiation of the voltage-glitch-protected S/R latch 422b is used for DFT purposes since the second glitch-proof latch is the only volatile memory element on this secure chip that can survive both a voltage-glitch-event (which is not detected as a full power-down by the second CMOS level-detector 414b) and a subsequent chip-reset. By coupling a DFT PULSE_Latched signal directly to the DFT/Logic 408, the chip can "remember" if there was a voltage-glitch prior to the last chip-reset event. Thus, the DFT/Logic 408 enables the chip to know that a voltage-glitch event or SCA was detected, thereby enabling testing and calibration of the circuits in the voltage-glitch-detection-block 418.

The voltage-glitch-detector 420 can include any suitable voltage or current based comparator capable of detecting a SCA or a voltage-glitch with similar properties. Properties of a voltage-glitch detected by the voltage-glitch-detector 420 can include a rapid drop or decrease in the main supply voltage (VDD) to less than a predetermined target glitch- or set-point voltage ($V_{GLITCH}$), and a narrow pulse width or power down time (tpD) below $V_{GLITCH}$ as low as about 20 ns. Under these conditions, a comparator of a suitable voltage-glitch-detector 420 is able to deliver a voltage-glitch detection pulse (PULSE) wide enough either to directly trigger the first CMOS-level-detector 414a, or to set the first voltage-glitch protected S/R latch 422a.

Generally, the voltage-glitch-detector 420 receives a trimmed reference voltage ($V_{GLITCH-TRIMMED}$) substantially equal to the threshold detection level ($V_{GLITCH}$) of the target glitch-voltage from a reference voltage generator 425 in the voltage-glitch-detection-block 418. The reference voltage generator 425 receives a band-gap reference (BGREF) voltage, and a digital voltage trim ($V_{Trim}$) signal directly from the programmable power-up driver 406 to generate a $V_{GLITCH-TRIMMED}$ voltage of from 0.9V to 2.3V, adjustable in 50 mV increments or steps. The $V_{GLITCH-TRIMMED}$ voltage is generated within the reference voltage generator 425 by a voltage adder circuit (shown, for example, in FIG. 8) which can generate up to a 2.3V using two voltage inputs which are lower or equal to 1.2v. The two inputs to the voltage adder are taken from a 50 mV resolution 0V-1.2V voltage ladder within the reference voltage generator 425. Although shown in this embodiment as separate from the voltage-glitch-detector 420 it will be understood that the reference voltage generator 425 can alternatively be included in the voltage-glitch-detector.

Also, in the embodiment shown, the voltage-glitch-detection-block 418 further includes a second logic gate 426 through which the voltage-glitch-detector 420 is coupled to the programmable power-up driver 406. The second logic gate 426 receives an enable signal and a band-gap reference okay (BGREF_OK) signal from the programmable power-up driver 406 and outputs a voltage-glitch-detection enable (EN) signal to the voltage-glitch-detector 420.

As noted above, the voltage-glitch-detector 420 can include any suitable voltage or current based comparator circuit. In some embodiments the voltage-glitch-detector 420 is or includes a current-comparator. Current-comparator-based voltage-glitch-detectors provide a number of advantages over a voltage-comparator-based voltage-glitch-detector, including being easier to isolate from extreme voltage-glitches that could otherwise negatively impact operation of the voltage-glitch-detector 420 and the function of the voltage-glitch detection and protection circuit 400.

Figure 5:
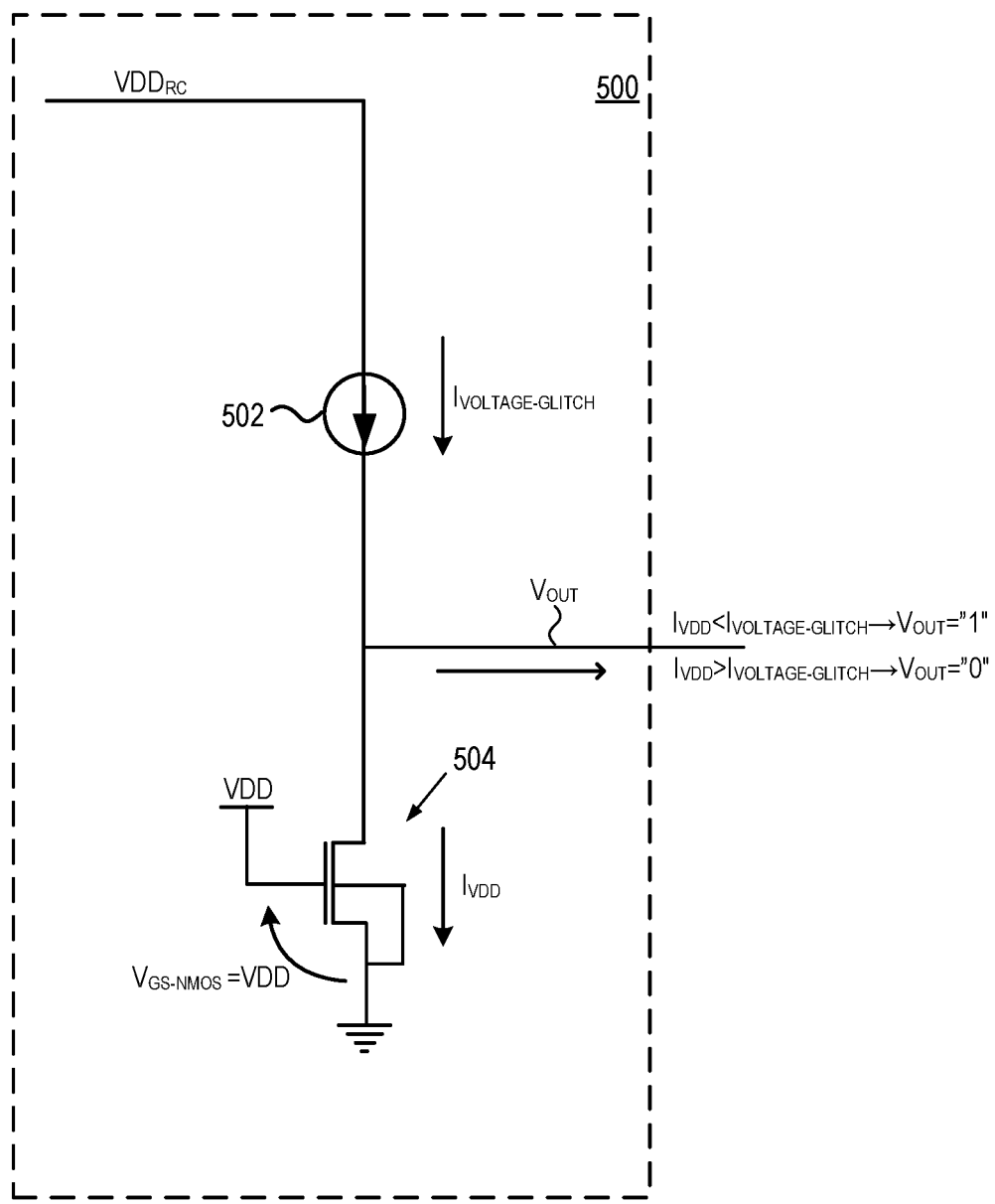
FIG. 5 is a schematic diagram illustrating an embodiment of a current comparator for use in a voltage-glitch-detector.

An embodiment of a current-comparator suitable for use in the voltage-glitch-detector of FIG. 4 will now be described with reference to FIG. 5. Referring to FIG. 5, a comparator circuit 500 generally includes a current-source 502 coupled in series with an n-channel metal-oxide-silicon field-effect-transistor (nMOS 504) between the comparator's isolated supply voltage ($VDD_{COMP\_RC}$) and ground. By comparator isolated supply voltage it is meant the comparator's supply voltage ($VDD_{COMP\_RC}$) is isolated from high-frequency/high-slope events on a chip's glitch-monitored supply voltage (generally referred here as VDD or $VDD_{CHIP}$) by, for example, a low-pass-filter or resistor-capacitor (RC) filter. This isolation significantly reduces disturbing variations in voltage to the comparator circuit 500 arising from a fast voltage-glitch on VDD or $VDD_{CHIP}$, for the period of time needed for the comparator to safely generate a voltage-glitch detection indication. The nMOS 504 has a source and body junction coupled in common to ground, and a gate coupled to the glitch-monitored supply voltage (VDD or $VDD_{CHIP}$). The voltage-glitch-isolated current-source 502 receives a reference voltage ($V_{REF}$) (not shown in this figure), and provides a reference current ($I_{VOLTAGE-GLITCH}$) that is substantially equal to a current through the nMOS 504 operating with a gate-to-source voltage ($V_{GS-NMOS}$) of $V_{VOLTAGE-GLITCH}$, where $V_{VOLTAGE-GLITCH}$ is the trip-point of the comparator and is considered as the VDD (or $VDD_{CHIP}$) level from which below levels are to be considered as voltage-glitch. In some embodiments, the reference voltage ($V_{REF}$) is also provided to the current-source 502 through an RC filter so that the current-source is a voltage-glitch-isolated current-source. In operation, when VDD or $VDD_{CHIP}$ coupled to the gate of the nMOS 504 drops below $V_{VOLTAGE-GLITCH}$ the current through the nMOS due to VDD ($I_{VDD}$) decreases to less than reference current ($I_{VOLTAGE-GLITCH}$), and as a result a voltage on an output ($V_{OUT}$) of the comparator circuit 500 becomes a logic high or a "1." Conversely if VDD is higher or greater than the $V_{VOLTAGE-GLITCH}$ the current through the nMOS 504 ($I_{VDD}$) is greater than the reference current ($I_{VOLTAGE-GLITCH}$) and the output ($V_{OUT}$) of the comparator circuit 500 becomes or remains a logic low or a "0."

Figure 6:
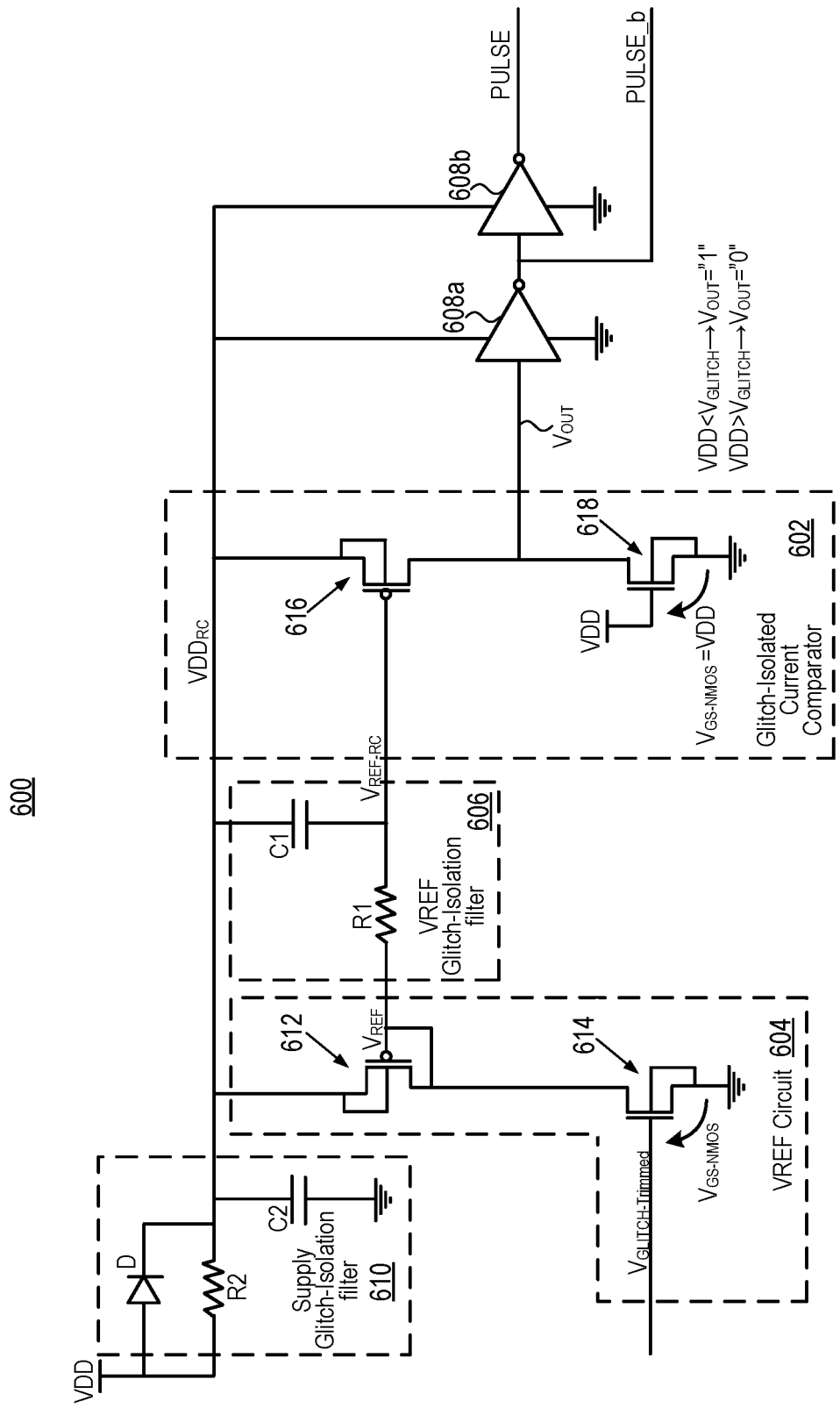
FIG. 6 is a schematic diagram illustrating an embodiment of a current-comparator-based-voltage-glitch-detector.

FIG. 6 is a simplified schematic diagram illustrating An embodiment of a current-comparator-based voltage-glitch-detector 600 including a p-channel metal-oxide-silicon field-effect-transistor (pMOS) as a current-source in a glitch-isolated current-comparator 602. Referring to FIG. 6 the voltage-glitch-detector 600 includes, in addition to the current-comparator 602 a voltage reference ($V_{REF}$) circuit 604 coupled to the current-comparator through a $V_{REF}$ voltage-glitch-isolation filter 606, first and second inverters 608a, 608b, coupled in series to an output ($V_{OUT}$) of the current-comparator to generate a voltage-glitch detection pulse (PULSE) and a voltage-glitch detection pulse complement (PULSE_b), and a supply voltage-glitch-isolation filter 610 through which a supply voltage (VDD) of the chip is provided to the current-comparator 602, $V_{REF}$ circuit 604 and the inverters 608a, 608b. The $V_{REF}$ voltage-glitch-isolation filter 606 includes a resistor-capacitor (RC) filter, including a resistor R1 and capacitor C1, to significantly reduce disturbing variations in a filtered reference voltage ($V_{REF-RC}$) relative to $V_{REF}$ arising from fast voltage-glitch on VDD. The supply voltage-glitch-isolation filter 610 also includes a resistor-capacitor (RC) filter, including a resistor R2 and capacitor C2, that significantly reduces functional disturbing variations in the supply voltage (VDD) arising from a fast voltage-glitch. The voltage-glitch-isolation filter 610 is designed to keep the $VDD_{RC}$ at voltage levels at which the voltage-glitch-detector 600 and current-comparator 602 are fully operational, even—or especially when VDD is rapidly ramped down to sub-CMOS or negative voltage levels. The supply voltage-glitch-isolation filter 610 further includes a diode (D) coupled in parallel with resistor (R2) to enable fast recovery of $VDD_{RC}$ when VDD is rapidly ramped up from below $V_{VOLTAGE-GLITCH}$, such as in the event of repeated voltage-glitches or SCAs, that attempt to compromise filtered supplies such as $VDD_{RC}$ by averaging them down to below operational levels. The diode (D) also supports fast power-up in circumstances in which it is desirable $VDD_{RC}$ should reach full CMOS operational levels quickly, such as when VDD returns rapidly to pre-voltage-glitch levels.

The $V_{REF}$ circuit 604 includes a first pair of a pMOS 612 and an nMOS 614 coupled in series between $VDD_{RC}$ and ground. A gate of the nMOS 614 receives a trimmed voltage-glitch signal ($V_{GLITCH-Trimmed}$) from the reference voltage generator 425 in the voltage-glitch-detection-block 418 or voltage-glitch-detector 420. This reference voltage which is the $V_{GS-NMOS}$ of nMOS 614 induces a drain-to-source ($I_{DS}$) current in nMOS 614 equal to $I_{VOLTAGE-GLITCH}$, which in turn forces the same current on pMOS 612. Transistor pMOS 612 is connected as the current bias in a current mirror configuration to pMOS 616, and thus pMOS 616 acts as a current source with a current equal to $I_{VOLTAGE-GLITCH}$. Since the gate of pMOS 612 ($V_{REF}$) is connected to its drain, its gate voltage relative to $VDD_{RC}$, which is equal to the gate-to-source voltage of pMOS 612 ($V_{GS-PMOS}$), directly depends on $I_{VOLTAGE-GLITCH}$ and thus on $V_{VOLTAGE-GLITCH-TRIMMED}$. Transistors pMOS 612 and pMOS 616 share and/or couple their gate voltages, which are $V_{REF}$ and $V_{REF-RC}$ respectively, through a resistor (R1) of the $V_{REF}$ voltage-glitch-isolation filter 606, and when a voltage-glitch is introduced on supply voltage (VDD), the current through the $V_{REF}$ circuit 604 will immediately change to substantially different than $I_{VOLTAGE-GLITCH}$, and thus, $VDD_{RC}$-$V_{REF}$ will substantially change too, while the target current of the current-source pMOS 616 in the current-comparator 602 which depends on $VDD_{RC}$-$V_{REF-RC}$, will remain stable long enough to maintain the target current of the current-source pMOS 616 and enable the current-comparator to detect whether a destructive voltage-glitch has occurred.

The current-comparator 602 includes in addition to pMOS 616 an nMOS transistor (nMOS 618) coupled in series between $VDD_{RC}$ and ground. A gate of the nMOS 618 receives a non-isolated supply voltage (VDD) so that a gate-to-source voltage across the nMOS is substantially equal to the supply voltage (VDD). If the supply voltage (VDD) is subject to a voltage-glitch such that VDD drops to less than $V_{VOLTAGE-GLITCH}$, the gate-to-source voltage ($V_{GS-NMOS}$) also drops, lowering the current through nMOS 618 and moving the output ($V_{OUT}$) of the current-comparator 602 to a logic high or a "1." Conversely if VDD is higher or greater than $V_{VOLTAGE-GLITCH}$ the output ($V_{OUT}$) of the comparator circuit 602 becomes or remains a logic low or a "0."

Figure 7:
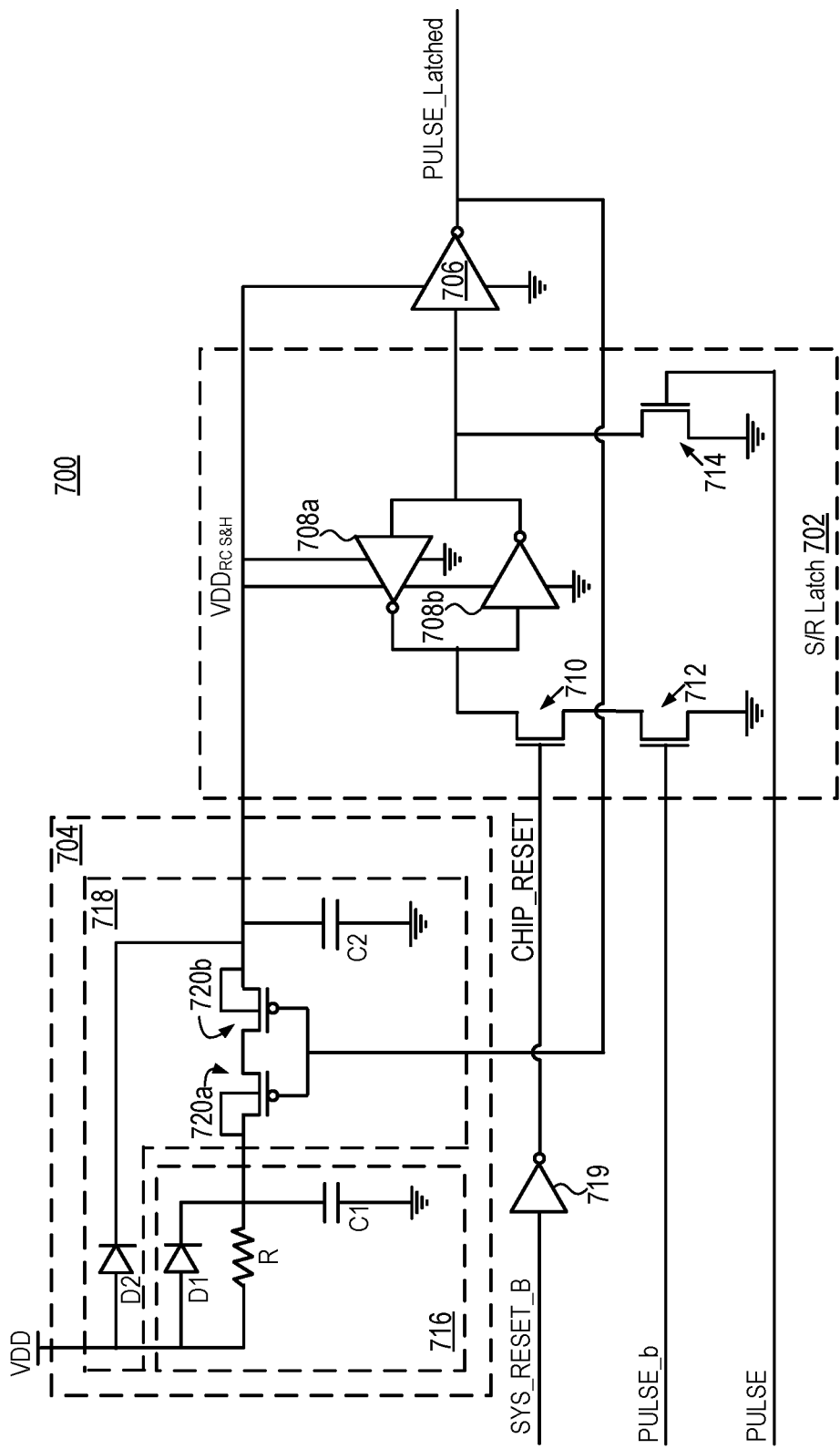
FIG. 7 is a schematic diagram illustrating an embodiment of a voltage-glitch-isolated latch including a supply voltage-glitch-isolation filter and a sample and hold (S&H) circuit.

FIG. 7 is a schematic diagram illustrating an embodiment of a voltage-glitch protected or isolated latch 700 suitable for use with any of the above described voltage-glitch-detectors, and in the voltage-glitch-detection-block 418 shown in FIG. 4. Referring to FIG. 7 the voltage-glitch-isolated latch 700 generally includes a set/reset (S/R) latch 702 coupled to the chip supply voltage (VDD) through a supply voltage glitch-isolation-filter (GIF)716 and sample and hold (S&H) circuit 718, and an inverter 706 coupled to a single output of the S/R latch.

In the embodiment shown the S/R latch circuit 702 is a bi-stable latch similar to an SRAM (Static random-access memory) cell. However, it will be understood that the S/R latch circuit 702 can alternatively be implemented using any known logic structure that provides a latch with set/reset functionality. The latch further includes a pair of back to back inverters 708a, 708b, a pair of transistors, including first nMOS 710, and a second nMOS 712, coupled in series between ground and a first side of the inverters, and a third nMOS transistor 714 coupled between ground and a second side of the inverters, which serves as the output of the S/R latch 702 to output a voltage-glitch pulse_latched (PULSE_Latched) signal.

A gate of the first nMOS 710 serves as reset input to the S/R latch 702 and receives a SYS_RESET_B signal from the first logic gate 424 in the system reset block 416 of FIG. 4 using an inverter 719. A gate of the second nMOS 712 serves as a first input and is coupled to an output of the voltage-glitch-detector 600 to receive a voltage-glitch detection pulse complement (PULSE_b), to make sure that as long as the voltage-glitch detector output is showing VOLTAGE-GLITCH_PULSE, the voltage-glitch protected S/R latch 702 does not allow a reset to the S/R latch due to Chip-Reset, and will show a PULSE_Latched signal as long as VOLTAGE-GLITCH_PULSE is active. The gate of the third nMOS 714 serves as a second input and is coupled to an output of the voltage-glitch-detector 600 to receive a voltage-glitch detection pulse (PULSE).

A circuit 704 includes a supply voltage-glitch-isolation filter 716 and an S&H circuit 718. The supply voltage-glitch-isolation filter 716 includes a resistor R and a first diode D1 coupled in parallel to the chip supply voltage (VDD) and through a first capacitor C1 to ground. As with $V_{REF}$ voltage-glitch-isolation filter 606 and supply voltage-glitch-isolation filter 610, described above with respect to FIG. 6, the supply voltage-glitch-isolation filter 716 is designed to isolate $VDD_{RC-S\&H}$ from high-frequency changes in the supply voltage (VDD) arising from a voltage-glitch. The S&H circuit 718 includes a second diode D2 coupled in series between to the chip supply voltage (VDD) and $VDD_{RC-S\&H}$, and a second capacitor C2 coupled between $VDD_{RC-S\&H}$ and ground, and a pair of pMOS transistors 720a, 720b, coupled between the first and second capacitors C1, C2, that acts as a PMOS switch in the S&H switch. Gates of the pMOS transistors 720a, 720b, are coupled in parallel to the output of the inverter 706 to receive the PULSE_Latched signal. The PULSE_Latched signal causes the pMOS transistors 720a, 720b, to turn off, isolating the voltage (VDD$_{RC\_S\&H}$) supplied to the S/R latch 702 and the inverter 706 from VDD, and enabling the glitch-isolated latch 700 to provide its own supply voltage once a voltage-glitch has been detected by the voltage-glitch-detector 600 and the PULSE_Latched signal generated, thereby isolating voltage-glitch-isolated latch from extreme voltage-glitch conditions, and increasing reliability of the voltage-glitch detection and protection circuit.

Figure 8:
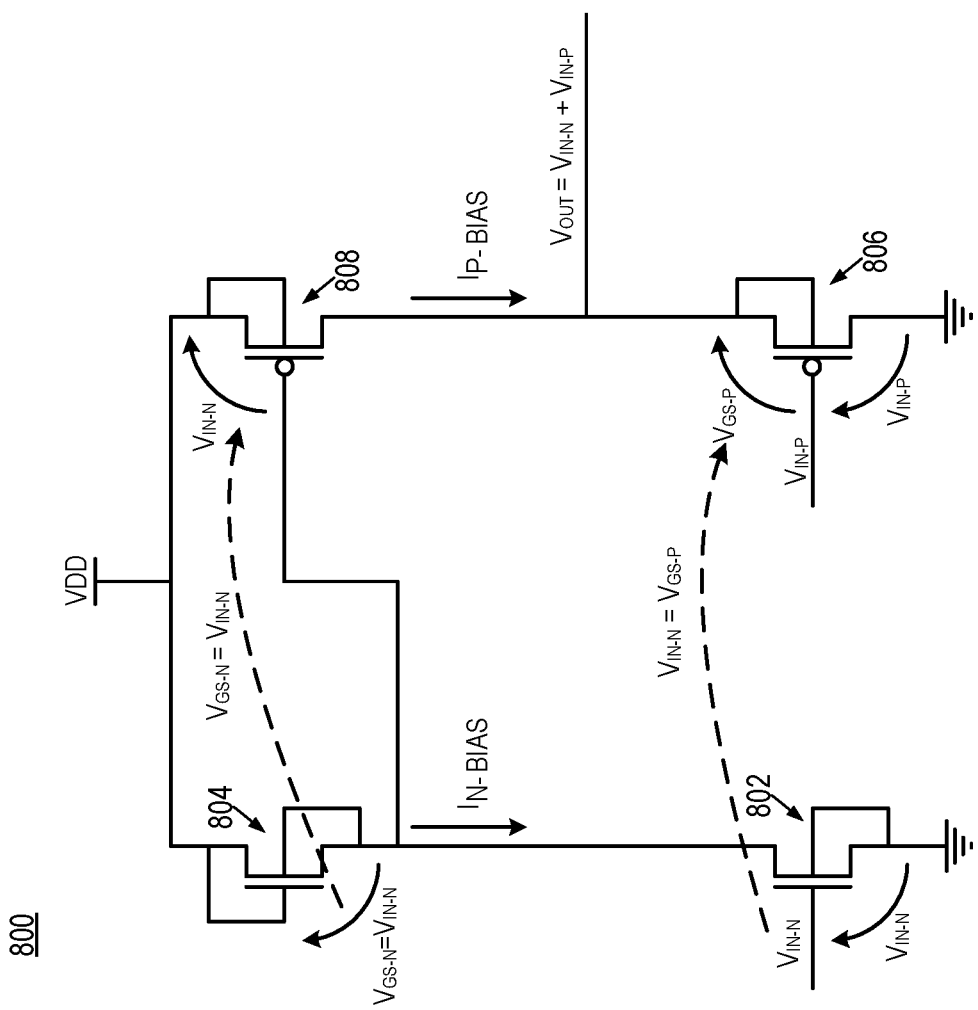
FIG. 8 is a schematic diagram illustrating an embodiment of a four transistor voltage-adder, utilizing a voltage-mirroring technique, for providing to a voltage-glitch-detector an accurate reference voltage as much as 2× higher than a maximum available reference voltage on the chip.

An alternative embodiment of a circuit for generating reference voltage (V$_{REF}$) to a voltage or current-based voltage-glitch-detector will now be described with reference to FIG. 8. In particular, FIG. 8 is a schematic diagram illustrating an embodiment of a four transistor voltage-adder, utilizing a voltage mirroring technique, for providing to a voltage-glitch-detector a reference voltage as much 2 times higher than a maximum available on-chip reference voltage, typically about 1.2V. Referring to FIG. 8 the voltage mirror 800 generally includes a first pair of substantially same sized nMOS transistors 802, 804, coupled in series between a voltage supply VDD and ground, and a second pair of substantially same sized pMOS transistors 806, 808, coupled in parallel with the first pair of transistors. A gate of a first nMOS transistor 802 is coupled to a first input voltage (V$_{IN-N}$). A gate of the second nMOS transistor 804 is coupled to its drain to function as a diode with characteristics similar to nMOS transistor 802. A gate of the first pMOS transistor 806 is coupled to a second input voltage (V$_{IN-P}$). A gate of the second pMOS transistor 808 is coupled between the source of the second nMOS transistor 804 the drain of the first nMOS transistor 802. Bulk or body junctions of all devices 802-804 are connected to their respective source nodes.

In operation, a gate-source voltage (V$_{GS}$) of the second nMOS transistor 804 is equal to V$_{IN-N}$ which is the V$_{GS-N\_802}$ of nMOS 802, and is voltage mirrored to the gate of the second pMOS transistor 808 making V$_{GS-P\_808}$=V$_{GS-N\_804}$, and this causes a gate-source voltage (V$_{GS}$) of the first pMOS transistor 806 to be equal to the gate-source voltage (V$_{GS}$) of the first nMOS transistor 802. Unlike in a conventional current mirror, where drain-to-source current (I$_{DS}$) current matching is mirrored from one side of the mirror to the other, in the voltage mirror 800 a magnitude of a current (I$_{N-BIAS}$) through the first and second nMOS transistors 802, 804, is different (higher or lower) than the current (I$_{P-BIAS}$) through the second pMOS transistors 806, 808, and the matching from side to side is of the V$_{GS}$ rather than the I$_{DS}$. Thus, where V$_{IN-N}$ is greater than a maximum of the nMOS threshold voltage (V$_{TN}$) and of the pMOS threshold voltage Vtp, and V$_{IN-P}$ is greater than the negative magnitude of the absolute value of Vtp (−|V$_{TP}$|), the output (V$_{OUT}$) of the voltage mirror 800 will be the sum of V$_{IN-N}$ and V$_{IN-P}$. This means that to the extent of the absolute value of Vtp (|Vtp|) the V$_{IN-P}$ input to pMOS 806 can go negative, and the circuit will still act as a voltage adder.

The voltage mirror 800 of FIG. 8 is capable of providing reference voltage (V$_{REF}$) between 900 mV to about 2.3V, and is adjustable within 50 mV steps or increments, where V$_{IN-N}$ is in a range of about 900 mV to 1.15V, and V$_{IN-P}$ is in a range of 0V to 1.15V. For example, where VDD into the voltage mirror 800 is 2.4V, V$_{IN-N}$ is 900 mV and V$_{IN-P}$ is 0V the output is 900 mV. Where VDD into the voltage mirror 800 is 2.4V, V$_{IN-N}$ is 1.15V and V$_{IN-P}$ is 1.1V the output is 2.25V.

In addition to having an output voltage adjustable within 50 mV steps or increments, the voltage mirror 800 has high impedance inputs, requires no feedback or current inputs, can be fabricated using many different fabrication technologies, and has a low area without resistors.

Figure 9A:
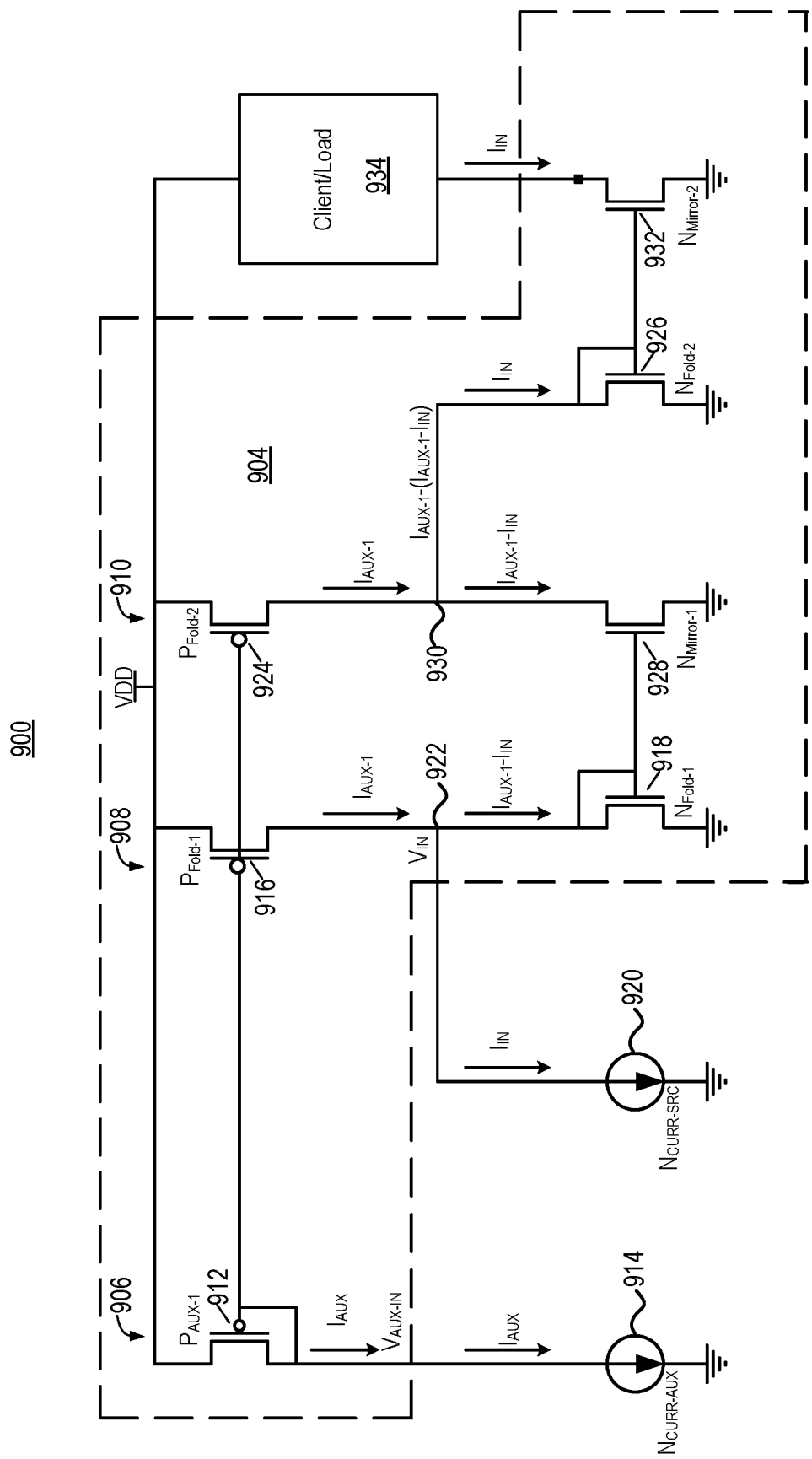
FIGS. 9A and 9B are schematic diagrams illustrating an embodiment of a current-mirroring circuit for use in a voltage-glitch detection and protection circuit, and which provides reliable voltage-glitch detection reference current mirroring of a reference current originated from a high saturation voltage current source at VDD levels much lower than a minimum user supply voltage ($VDD_{MIN}$) or even lower than BOD levels.
Figure 9B:
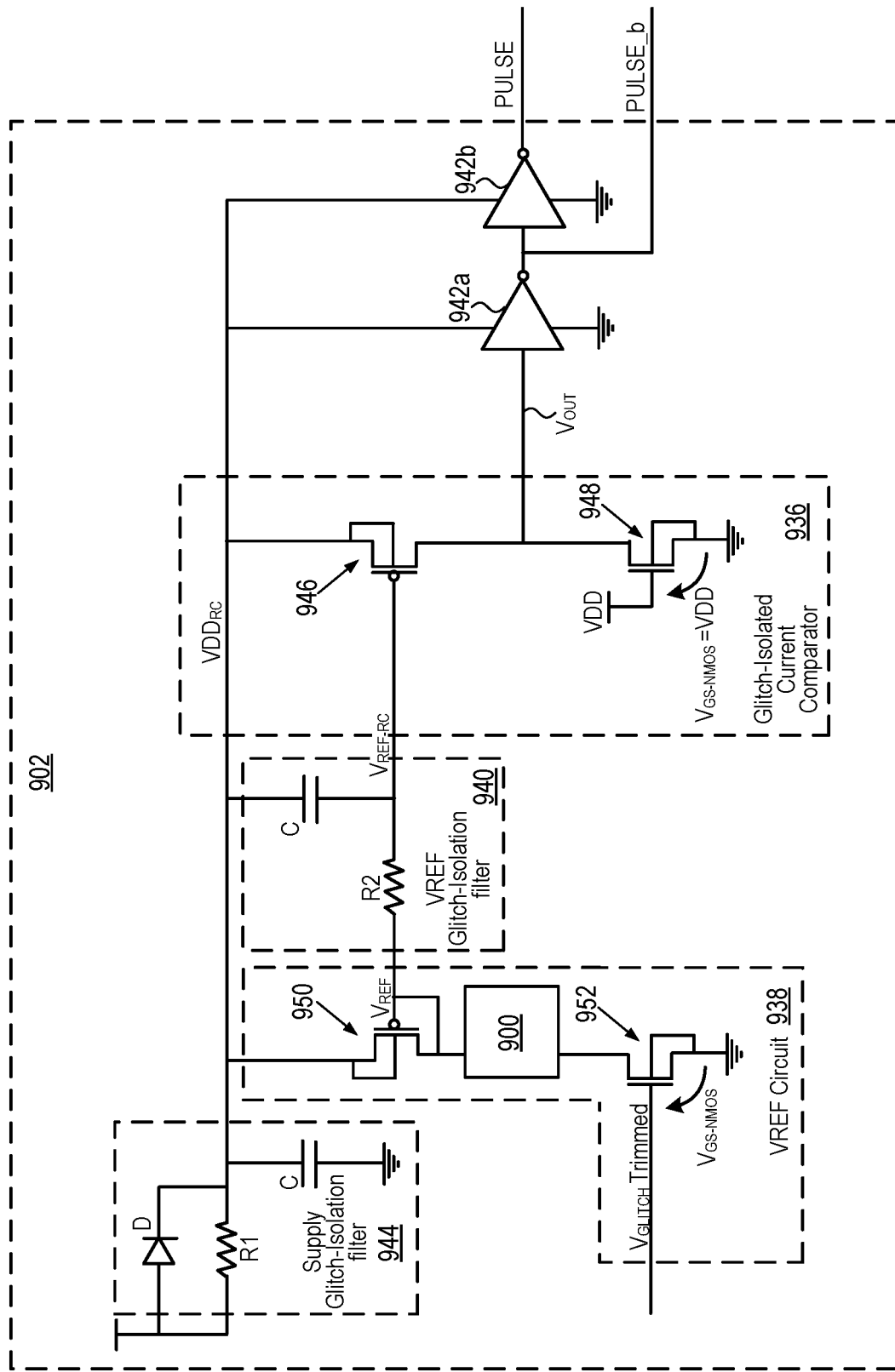

FIGS. 9A and 9B are schematic diagrams illustrating an embodiment of a current-mirroring circuit 900 suitable for generating a reference current and for use in a voltage-glitch detection and protection circuit.

FIG. 9A illustrates a schematic diagram of an embodiment of the current-mirroring circuit 900. Referring to FIG. 9A, the current-mirroring circuit 900 includes a two-stage folding current-mirror 904 having at least two-stages including a first or auxiliary leg 906, a second leg or first fold (fold-1 908) and a third leg or second fold (fold-2 910). The auxiliary leg 906 includes a first pMOS transistor (P$_{AUX-1}$ 912) coupled between a supply voltage (VDD) and an auxiliary current source N$_{CURR-AUX}$ 914. The second leg or first fold (fold-1 908) includes a second pMOS transistor (P$_{Fold-1}$ 916) and a first nMOS transistor (N$_{Fold-1}$ 918) coupled in series between VDD and ground, where a current source N$_{CURR-SRC}$ 920 is coupled between ground and a first node 922 between the transistors. The third leg or second fold (fold-2 910) includes a third pMOS transistor (P$_{Fold-2}$ 924) coupled in series with a second nMOS transistor (N$_{Fold-2}$ 926) between VDD and ground. The current-mirror 904 further includes a first nMOS mirroring transistor (N$_{MIRROR-1}$ 928) coupled to a second node 930 between the P$_{Fold-2}$ 924 and N$_{Fold-2}$ 926 transistors and ground, and a second mirroring transistor (N$_{MIRROR-2}$ 932) coupled between a Client/load 934 and ground. The gates of the N$_{Fold-2}$ 918 and N$_{MIRROR-1}$ 928 are coupled to the first node 922, and the gates of the N$_{Fold-2}$ 926 and N$_{MIRROR-2}$ 932 transistors are coupled to the second node 930. The gates of all the pMOS transistors, P$_{AUX-1}$, P$_{Fold-1}$ and P$_{Fold-2}$, transistors 912, 916, 924, are coupled in parallel to the auxiliary current source N$_{CURR-AUX}$ 916.

In operation, each stage or fold 908, 910, allows to reduce the saturation-voltage of the previous stage by a threshold voltage (V$_{TH-N}$) of the N$_{Fold-1}$ 918 and N$_{Fold-2}$ 926 transistors, in the stage, thereby enabling use of high saturation-voltage input current-source, N$_{CURR\_SRC}$ 920, while providing a low saturation-voltage output current-source to the Client/load 934. It should be noted that I$_{AUX-1}$>I$_{IN}$ so the I$_{AUX-1}$-I$_{IN}$ is high enough to enable N$_{FOLD-1}$ 918 and N$_{MIRROR-1}$ 928 to perform as an accurate current mirror.

FIG. 9B illustrates the incorporation of the current-mirroring circuit 900 into a voltage-glitch-detector 902 of a voltage-glitch detection and protection circuit. Referring to FIG. 9B, the voltage-glitch-detector 902 includes a current-comparator 936 a voltage reference (V$_{REF}$) circuit 938 coupled to the current-comparator through a V$_{REF}$ voltage-glitch-isolation filter 940, first and second inverters 942a, 942b, coupled in series to an output (V$_{OUT}$) of the current-comparator, and a supply voltage-glitch-isolation filter 944 through which a supply voltage (VDD) of the chip is supplied to circuits and sub-circuits of the voltage-glitch-detector. The current-comparator 936 includes a pMOS 946 and an nMOS transistor 948, coupled in series between VDD$_{RC}$ and ground. A gate of the pMOS 946 is coupled through the V$_{REF}$ voltage-glitch-isolation filter 940 to the V$_{REF}$ circuit 938, and a gate of the nMOS 948 is coupled to VDD. The V$_{REF}$ voltage-glitch-isolation filter 940 includes a resistor-capacitor (RC) filter to significantly reduce disturbing variations in reference voltage (V$_{REF}$) relative to VDD$_{RC}$ arising from a fast voltage-glitch on VDD. The supply voltage-glitch-isolation filter 944 also includes a resistor-capacitor (RC) filter that significantly reduces functional disturbing variations in the supply voltage (VDD) arising from a fast voltage-glitch.

The $V_{REF}$ circuit 938 includes a pMOS 950 and an nMOS 952 coupled in series between $VDD_{RC}$ and ground, with an embodiment of the current-mirroring circuit 900 of FIG. 9A coupled there between. As with embodiments of the voltage-glitch-detector described above, the gate of the nMOS 952 receives a trimmed voltage-glitch signal ($V_{GLITCH}$ Trimmed), which induces a drain-to-source ($I_{DS}$) current in nMOS 952 equal to $I_{VOLTAGE-GLITCH}$. This current is in turn connected through the current-mirroring circuit 900 to pMOS 950, enabling pMOS 950 to act as a current source with a current equal to $I_{VOLTAGE-GLITCH}$ and generate $V_{REF}$. The current-mirroring circuit 900 enables the voltage-glitch-detector 902 to detect voltage-glitch events that start from a VDD voltage which is very close to the $V_{GLITCH-Trimmed}$ while still maintaining an accurate $V_{GLITCH-Trimmed}$ voltage detection point. In case where VDD is higher than $V_{GLITCH-Trimmed}$ by only 100 mv, the high-saturation voltage $VDSAT_{N\_952}$ of current-source nMOS 952 can't be satisfied due to not having enough voltage range between $VDD_{RC}$ and ground to maintain $VDSAT_{N\_952}+VTH_{P\_950}+VDSAT_{P\_950}$. This drives current-source nMOS 952 to the linear region which reduces its $I_{VOLTAGE-GLITCH}$ current and cause a drop of the detection voltage below $V_{GLITCH-Trimmed}$.

Figure 10A:
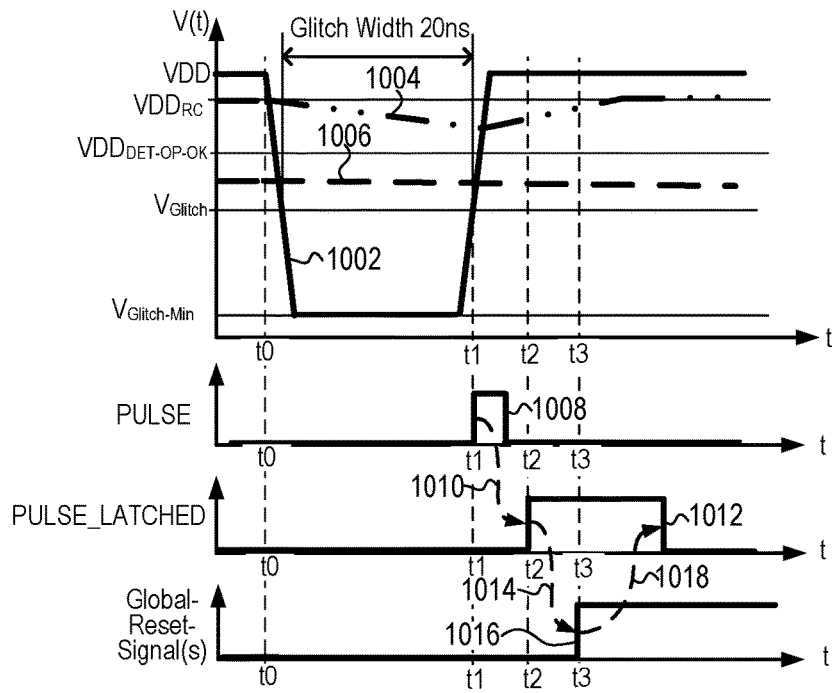
FIG. 10A are wave and timing diagrams illustrating an embodiment of a voltage-glitch detection and protection power reset scheme for a short voltage-glitch.
Figure 10B:
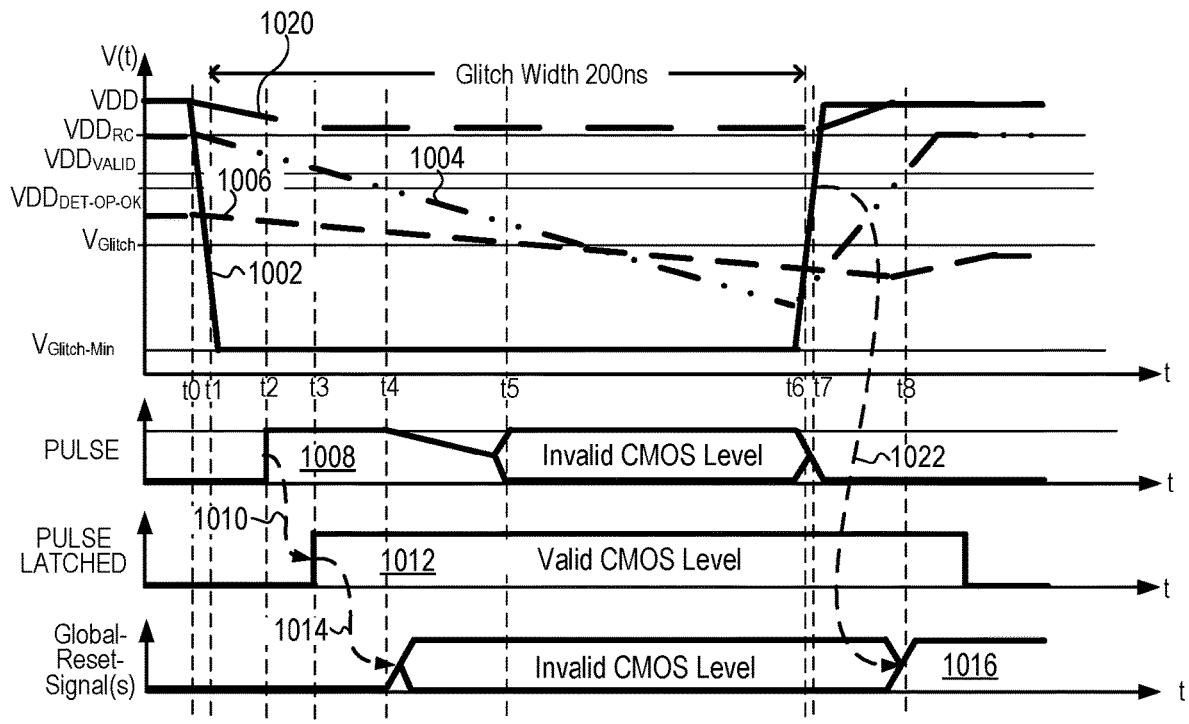
FIG. 10B are wave and timing diagrams illustrating an embodiment of a voltage-glitch detection and protection power reset scheme for a long voltage-glitch.

FIGS. 10A and 10B are timing diagrams showing signals resulting from detection of a voltage-glitch event by a voltage-glitch detection and protection circuit including a voltage-glitch-detector and voltage-glitch-protected latch, such as those shown in FIGS. 6 and 7. In particular, FIG. 10A illustrates signals resulting from detection of a short, 20 ns, voltage-glitch event, while FIG. 10B illustrates the signals resulting from detection of a long, 200 ns, voltage-glitch event.

Referring to FIG. 10A at an initial time (t0) a chip main voltage supply (VDD 1002), in the top diagram, begins dropping rapidly from an initial voltage level (VDD) due to the short voltage-glitch event. At the same time, (t0), an isolated supply voltage ($VDD_{RC}$ 1004) and an isolated reference voltage ($V_{REF-RC}$ 1006) to a comparator in the voltage-glitch-detector also begin to drop, but much more slowly due to the voltage-glitch isolation filters. Generally, the $V_{REF-RC}$ 1006 drops at a rate or slope of less than about 20 mV/in 40 ns, and it is noted that as long as $VDD_{RC}$ 1004 remains above a minimum-detector operation voltage ($VDD_{DET-OP-OK}$) of about 1.4V the voltage-glitch-detector will continue to operate and can respond to the voltage-glitch event.

In particular or alternatively, in an embodiment in which the current comparator includes a pMOS input, such as pMOS 616 transistor shown in FIG. 6, the waveform of $V_{REF-RC}$ 1006 shown in the top diagram of FIG. 10A is actually a result of $VDD_{RC}-V_{REF-RC}$, since $V_{REF-RC}$ is an input to a gate of the pMOS in a current mirror configuration, which is coupled to $VDD_{RC}$ by a large capacitor (C), and will follow the $VDD_{RC}$ changes for high frequency changes. Thus, $VDD_{RC}-V_{REF-RC}$ will change little relative to $VDD-V_{REF}$, and will drop at a rate or slope of less than about 20 mV/in 40 ns, and as long as $VDD_{RC}$ 1004 remains above $VDD_{DET-OP-OK}$ and the glitch-detector will continue to operate and can respond to the glitch event.

Next, at time (t1) after a voltage-glitch width of about 20 ns the voltage-glitch-detector generates a voltage-glitch detection pulse (PULSE 1008) with a pulse width of at least about 10 ns, which is coupled to the voltage-glitch-protected latch, as represented by dashed arrow 1010. Shortly thereafter beginning at time (t2) the voltage-glitch-protected latch generates a voltage-glitch PULSE_Latched signal (PULSE_LATCHED 1012), which is coupled along with the PULSE to a PU/PD controller, as represented by dashed arrow 1014. Finally, at time (t4) the PU/PD controller generates global-reset-signal(s) 1016 to safely power up the devices and circuits on the secure chip in a predefined power-on-reset (POR) sequence, and to reset the voltage-glitch-protected latch as represented by dashed arrow 1018. It should be mentioned that FIG. 10A is an illustration and the PULSE 1008 can appear sooner than 20 ns, so as the PULSE_LATCHED 1012 that can appear after PULSE 1008, in a shorter delay than 10 ns.

FIG. 10B shows timing diagrams showing signals resulting from detection of a long, >200 ns, voltage-glitch event, and illustrating the ability of the voltage-glitch-protected latch including a sample and hold (S&H) circuit to ensure a secure system reset following the long voltage-glitch event when signals from other circuits and blocks in the voltage-glitch detection and protection circuit become invalid during the voltage-glitch event.

Referring to FIG. 10B at time (t0) the chip main voltage supply (VDD 1002) begins dropping rapidly due to the sharp and long voltage-glitch event. Both isolated supplies voltage of the voltage-glitch detector and voltage-glitch-protected latch ($VDD_{RC}$ 1004, $VDD_{RC-S\&H}$ 1020 respectively) and isolated reference voltage ($V_{REF-RC}$ 1006) to the comparator in the voltage-glitch-detector also begin to drop, but much less rapidly due to the voltage-glitch isolation filters. As noted above, as long as $VDD_{RC}$ 1004 remains above a minimum-detector operation voltage ($VDD_{DET-OP-OK}$) the voltage-glitch-detector will continue to operate. At time (t1) VDD 1002 drops below $V_{VOLTAGE-GLITCH}$ and at time (t2), about 20 ns thereafter, the voltage-glitch-detector generates a rising edge of PULSE 1008, which is coupled to the voltage-glitch-protected latch, as represented by dashed arrow 1010 at time (t3). At about the same time, (t3), the voltage-glitch-protected latch generates a rising edge of PULSE_LATCHED 1012. The increased power required by the voltage-glitch-protected latch as a result of producing the PULSE_LATCHED 1012 will cause an isolated voltage (such as $VDD_{RC\_S\&H}$ in FIG. 7) supplied to the voltage-glitch-protected latch to decrease to a slightly lower voltage, while safely remaining above a predetermined minimum valid voltage ($VDD_{VALID}$). The voltage-glitch-protected latch isolated supply is disconnected from the main chip supply as a result of the rising edge of PULSE_LATCHED 1012, thereby enabling a sample and hold circuit (such as the S&H circuit 718 in FIG. 7) to hold the internal supply above $VDD_{VALID}$ for a time sufficient to ensure the PULSE_LATCHED 1012 signal is received in the PU/PD controller once the voltage-glitch event is over. A sufficient hold time can include, for example, a time≥14 μsec. For purposes of the example illustrated in FIG. 10B it is noted that the $VDD_{VALID}$ can be lower than $VDD_{DET-OP-OK}$, and can be of the magnitude of couple of hundred of millivolts above VTN or VTP, which is voltage large enough to cause a reset. It is further noted that 14 μsec is sufficient since other reset-detectors, such as the $2^{nd}$ CMOS level-detector 414b, will generate a SYS_RESET_B after VDD is restored for a voltage-glitch lasting longer than 14 μsec. It is noted that unlike with the short voltage-glitch event the voltage-glitch-detector will continue to output a PULSE 1008 until $VDD_{RC}$ 1004 drops below $VDD_{DET-OP-OK}$.

At time (t3) the voltage-glitch-protected latch generates the PULSE_LATCHED 1012 signal which is coupled or attempted to be coupled to the PU/PD controller, as represented by dashed arrow 1014. However, as VDD 1002, which supplies both the PU/PD controller and the CMOS level-detectors through which the PULSE_LATCHED 1012 signal is coupled, falls below $VDD_{VALID}$ and remains so until time (t7), no global-reset-signal(s) 1016 are generated. As notes above, the voltage-glitch-protected latch supply $VDD_{RC\text{-}S\&H}$ 1020 is disconnected from the supply VDD 1002 using the S&H circuit 718 upon the rising edge of the PULSE_LATCHED 1012 signal, which enables the S/R latch 702 to store logic data long enough after the voltage-glitch is over and supply level to the CMOS-Level detector and PU/PD controller regains valid CMOS levels. Since PULSE_LATCHED 1012 holds its logical valid value till after the voltage-glitch, a valid SYS_RESET_B is received in the PU/PD controller once the voltage-glitch event is over, and valid global reset signal 1016 is generated. It is further noted that 14 μsec is sufficient since other reset-detectors, such as the $2^{nd}$ CMOS level-detector 414b, will generate a SYS_RESET_B after VDD is restored for a voltage-glitch lasting longer than 14 μsec.

At time (t4) $VDD_{RC}$ 1004 drops below $VDD_{DET\text{-}OP\text{-}OK}$ and by time (t5) the output of the voltage-glitch-detector becomes unreliable due to invalid CMOS levels between time (t5) and time (t6).

Finally, VDD 1002 begins to rise from a minimum voltage-glitch voltage ($VDD_{VOLTAGE\text{-}GLITCH\text{-}MIN}$) to a level above $VDD_{DET\text{-}OP\text{-}OK}$ and by time (t6) and above $VDD_{VALID}$ by time (t7). Thus, at this time the VDD supplied to the PU/PD controller and the CMOS level-detectors through which the PULSE_LATCHED 1012 signal is coupled are able to resume operation, and the global-reset-signal(s) 1016 are generated, as indicated by arrow 1022.

Figure 11:
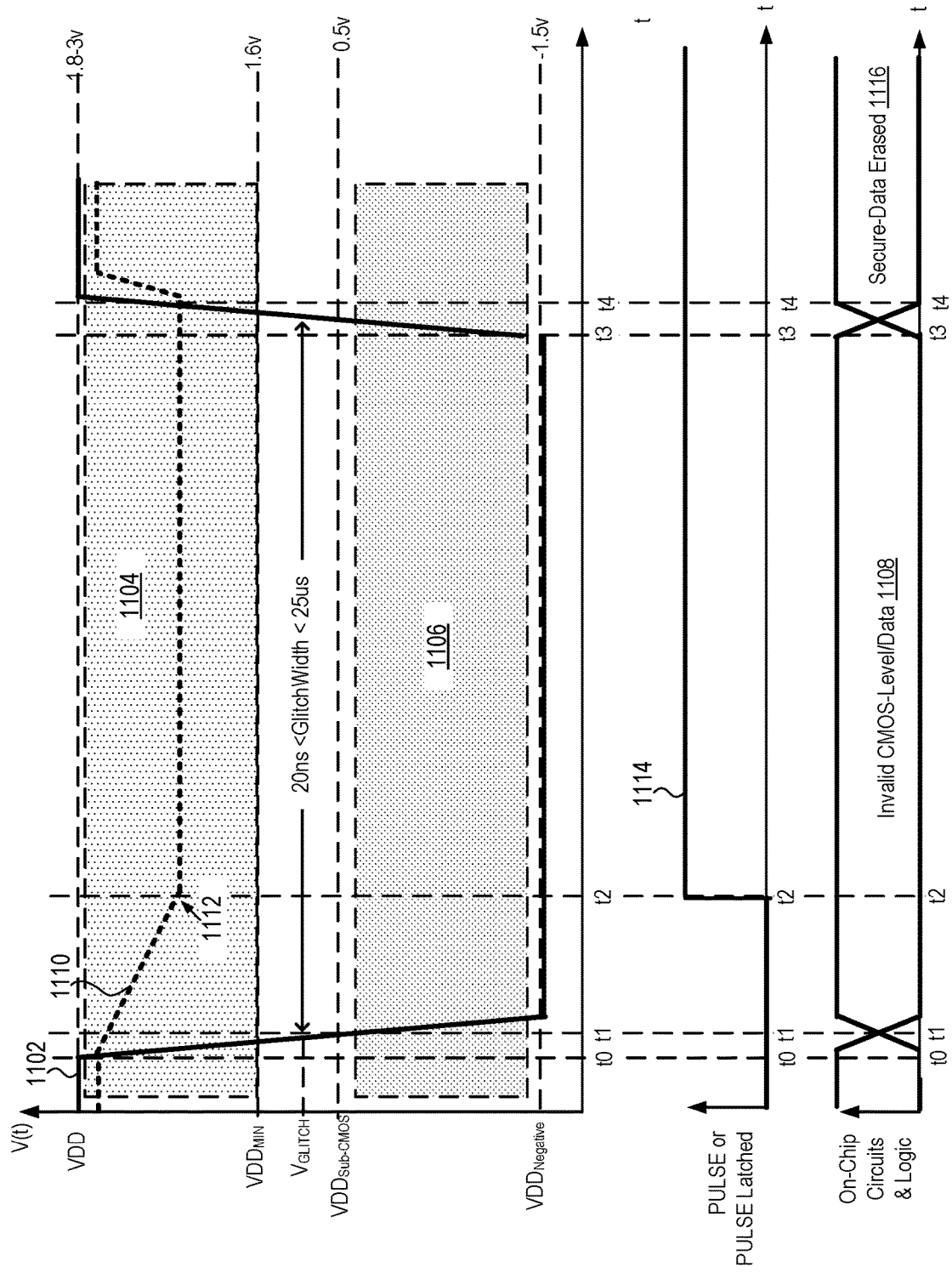
FIG. 11 is a wave diagram of a side channel voltage-glitch attack (SCA) on a secure chip including a voltage-glitch detection and protection circuit and signals in response thereto illustrating the ability of the circuit to protect against the SCA.

FIG. 11 is a wave diagram of a side channel voltage-glitch attack (SCA) on a secure chip including a voltage-glitch detection and protection circuit and signals in response thereto illustrating the ability of the circuit to protect against the SCA. Referring to FIG. 11 at an initial time (t0) the attack causes a supply voltage (VDD 1102) to the chip to begin falling rapidly at a slope of about 1V/ns. The supply voltage quickly falls out of a range of valid CMOS voltage levels, indicated by shaded box 1104, and by time (t1) VDD has dropped below a predefined voltage-glitch voltage ($V_{VOLTAGE\text{-}GLITCH}$) or trip-point. As the supply voltage continues to drop into a range of invalid CMOS voltage levels, indicated by shaded box 1106, causing analog and digital devices in the secure chip, including memory devices, and devices in the voltage-glitch detection and protection circuit such as the brown out-detector, to be become non-functional or compromised by invalid CMOS-levels or data as indicated by region 1108 in the operation status indication in the lower diagram. The voltage supply to the voltage-glitch-protected latch ($VDD_{DET\text{-}Latch}$), indicated by line 1110, which had begun dropping at the same time (t0) as the supply voltage to the chip (VDD 1102) albeit a slower rate due to the voltage-glitch-isolation filters, is maintained steady by the sample-and-hold (S&H) circuit as the voltage-glitch-detector 420 and the first glitch-protected S/R latch 422a begins to supply PULSE-OR-PULSE_Latched signal 1114, respectively, to the CMOS-Level Detector 414a as indicated by inflection point 1112 on line 1110. At substantially the same time, (t2), the voltage-glitch-detection-block 418 (and more specifically to the voltage-glitch protected latch 420a) continues to operate at a valid CMOS level, providing a PULSE-OR-PULSE_Latched signal 1114 throughout the remainder of the voltage-glitch event, as shown in the middle diagram.

Next, after a voltage-glitch-width or power down time of from about 20 ns up to about 25 μs at time (t3) the voltage-glitch-event ends and the supply voltage to the chip (VDD 1102) begins to rise sharply. Between time (t3) and time (t4) as the supply voltage to the chip (VDD 1102) rises towards valid CMOS levels the latched voltage-glitch detection signal 1114 which is coupled to the PU/PD controller by the CMOS-Level Detector 414a, causes a PU/PD controller in the voltage-glitch detection and protection circuit to execute a full system reset sequence beginning at time (t4). As shown in the lower diagram as indicated by region 1116 data in the secure domain is safely erased and/or secured from being compromised during the SCA.

Figure 12:
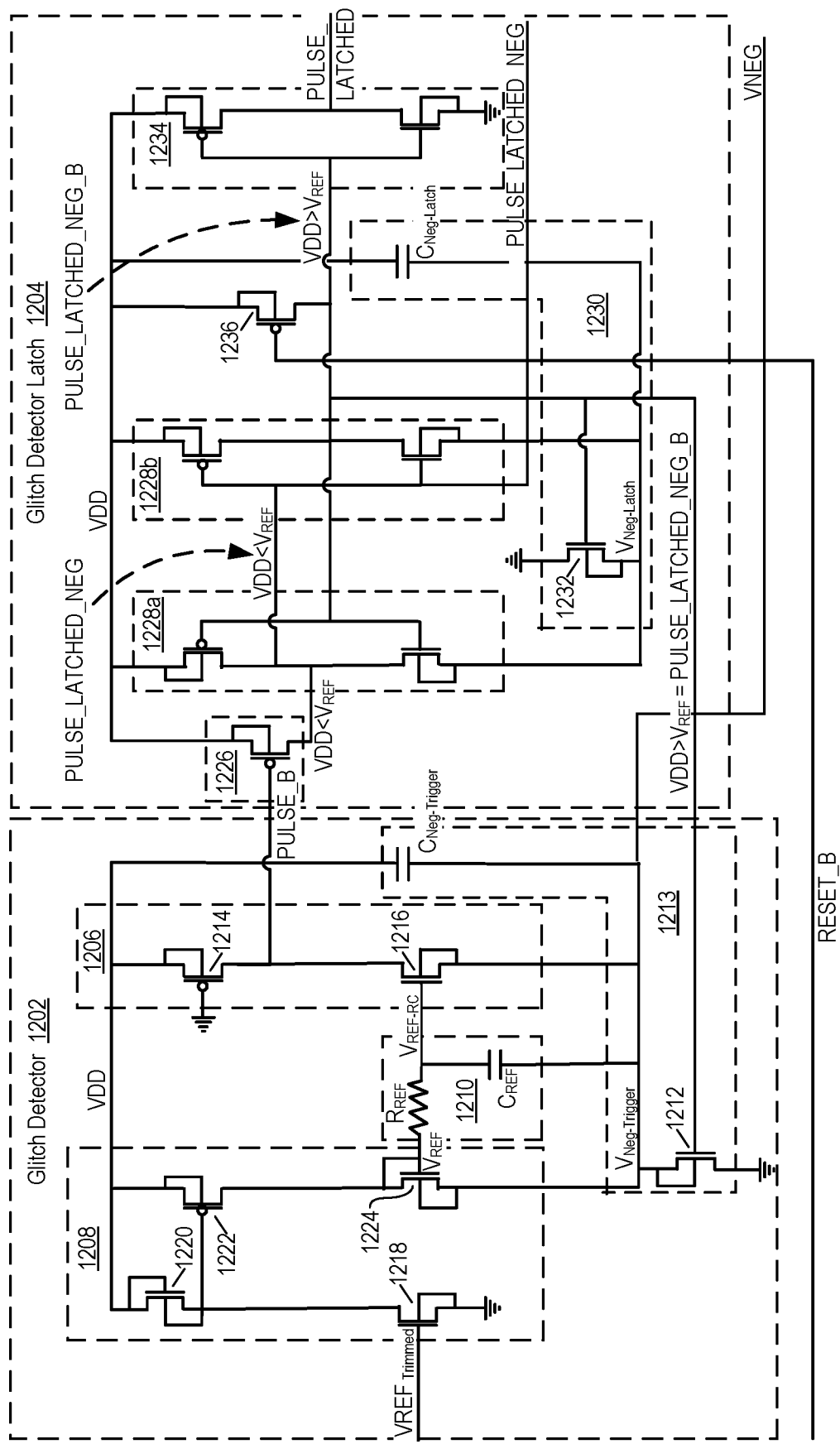
FIG. 12 is a schematic diagram illustrating another embodiment of a voltage-glitch-detector and a voltage-glitch-detector latch capable of operating in a negative voltage domain induced by a voltage-glitch.

FIG. 12 is a schematic diagram illustrating alternative embodiment of a voltage-glitch-detector 1202 and a voltage-glitch-detector latch 1204 capable of operating in a negative domain. It will be understood that the voltage-glitch-detector 1202 and voltage-glitch-detector latch 1204 can be used in a voltage-glitch detection and protection circuit, such as that described above, either in place of the voltage-glitch-detector and voltage-glitch-detector latch, or in addition to and coupled in parallel with the previously described voltage-glitch-detector and voltage-glitch-detector latch. It should be clarified that both the voltage-glitch-detector 1202 and the voltage-glitch-detector latch 1204 include supply isolation filters 1213, 1230 that perform similarly to the supply isolation filters 610, 716, respectively, in a manner where $VDD\text{-}V_{NEG\text{-}TRIGGER}$ behaves similar to $VDD_{RC}$-GND, and $VDD\text{-}V_{NEG\text{-}LATCH}$ behaves similar to $VDD_{RC\_S\&H}$-GND. The supply isolation filters in this case still filter the main supply (VDD) variations, but they do so by effectively lowering the local ground of the circuits to a negative voltage, keeping the circuits in operational voltage conditions relative to the VDD supply during a voltage glitch. Instead using resistors the isolation filters rely on the RDS resistance of the nMOS devices 1212 and 1232. In this alternative embodiment of the voltage-glitch-detector and latch (1202, 1204 respectively), both supply isolation filters (1213, 1230 respectively) are using a sample and hold switch (nMOS 1212, 1232 respectively) to sample their internal negative-domain supply relative to VDD ($VDD\text{-}V_{NEG\text{-}TRIGGER}$ and $VDD\text{-}V_{NEG\text{-}LATCH}$ respectively) upon a glitch detection PULSE_LATCHED_NEG_B falling edge. It should be also mentioned that the bulks of nMOS devices 1212 and 1232 are connected to their drain respectively, and this connection forms a diode that acts similarly to the diodes in supply voltage-glitch-isolation filter 610 and circuit 704 to enable fast recovery of the internal negative-supply domain when the VDD supply recovers from a glitch or performs fast power up. Finally, it should be noted that the nMOS switches 1212 and 1232 perform as resistor in an RC filter using their RDS, as sample-and-hold switches and as fast recovery diodes, all in a single device which make this alternative implementation more area efficient.

Referring to FIG. 12 the voltage-glitch-detector 1202 generally includes a current comparator 1206 with a $V_{REF\text{-}RC}$ input which is coupled to a $V_{REF}$ voltage generated by reference ($V_{REF}$) circuit 1208 through a $V_{REF}$ glitch isolation filter 1210, a supply isolation filter 1213 with negative domain ($V_{Neg\text{-}Trigger}$) comprising an nMOS transistor 1212 and a capacitor ($C_{Neg\text{-}Trigger}$). It is noted that the current comparator 1206 shown in FIG. 12 is similar in design and function to that shown in FIG. 5, but has an output that is active in the opposite polarity. Referring to FIG. 12, the current comparator 1206 includes a pMOS transistor 1214 an nMOS transistor 1216. The pMOS transistor 1214 includes a gate coupled to ground, a source and an N-well or body contact coupled to VDD, and a drain coupled to a drain of the nMOS transistor 1216. The nMOS transistor 1216 is coupled between the pMOS transistor 1214 and the negative domain supply 1213 ($V_{Neg\text{-}Trigger}$). A gate of the nMOS transistor 1216 is coupled through the $V_{REF}$ voltage-glitch-isolation filter 1210 to the $V_{REF}$ circuit 1208 to receive a $V_{REF\text{-}RC}$ reference voltage that allows it to act as a current-source with a voltage-glitch current ($I_{VOLTAGE\text{-}GLITCH}$) therefrom. The pMOS transistor 1214 provides a VDD current ($I_{VDD\text{-}CHIP}$). The $V_{REF}$ voltage-glitch-isolation filter 1210 is a resistor-capacitor (RC) filter including a resistor ($R_{REF}$) coupled between an output of the $V_{REF}$ circuit 1208 and gate of the nMOS transistor 1216, and a capacitor ($C_{REF}$) coupled between the negative domain supply 1213 ($V_{Neg\text{-}Trigger}$) and a junction of the reference resistor ($R_{REF}$) and a gate of the nMOS transistor 1216 of the current comparator 1206. The $V_{REF}$ circuit 1208 includes a first nMOS transistor 1218 and a second nMOS transistor 1220 coupled in series between VDD and ground, and a pMOS transistor 1222 coupled between VDD and a third nMOS transistor 1224, which is further coupled to negative domain supply 1213 ($V_{Neg\text{-}Trigger}$). The third nMOS transistor 1224 functions as the output of the $V_{REF}$ circuit and has a source and gate coupled to the gate of the of the nMOS transistor 1216 ($V_{REF\text{-}RC}$) in the current comparator 1206 through the $V_{REF}$ voltage-glitch-isolation filter 1210, and a drain coupled to the negative domain supply ($V_{Neg\text{-}Trigger}$). The third nMOS transistor 1224 acts as a current-mirror to nMOS transistor 1216 and provides a current bias reference that allows nMOS transistor 1216 to act as a current-source with a voltage-glitch current ($I_{VOLTAGE\text{-}GLITCH}$) within the current comparator 1206. It should be mentioned that the VREF circuit 1208 utilizes a voltage-mirroring technique between nMOS 1220 and pMOS 1222 to align the current-source (nMOS transistor 1216) of the current comparator 1206 to have $I_{VOLTAGE\text{-}GLITCH}$ current which is relative to $I_{VDD}$ that is generated by pMOS 1214.

Referring to FIG. 12 the voltage-glitch-detector latch 1204 generally includes a pMOS transistor 1226, which serves as a set b input to the latch, and is coupled between the chip supply voltage (VDD), and the output PULSE_LATCHED_NEG of a first inverter 1228a of a pair of back to back inverters 1228a, 1228b. The pMOS transistor 1226 includes a gate coupled to a shared drain PULSE_B of the current comparator's nMOS transistor 1216 and pMOS transistor 1214 in the glitch detector 1202 to receive a glitch detection pulse complement (PULSE_B). Inverters 1228a, 1228b, are coupled between VDD and, through a sample and hold (S&H) circuit 1230, to ground. The S&H circuit 1230 generally includes an nMOS transistor 1232 as a switch, coupled between the first and second inverters 1228a, 1228b, and ground, and a sample-and-hold capacitor ($C_{Neg\text{-}Latch}$) coupled between the nMOS transistor 1232 drain $V_{Neg\text{-}Latch}$ and VDD. The voltage-glitch-detector latch 1204 further includes a third or output inverter 1234 coupled between VDD and ground, and a second pMOS 1236 coupled between VDD and gates of transistors in the first and third inverters 1228a, 1234, which is also the PULSE_LATCHED_NEG_B output of inverter 1228b. A gate of the second pMOS 1236 receives a RESET_B signal from a complementary system reset signal (such of SYS_RESET_B in 400), and serves as a reset_b input to the voltage-glitch-detector latch 1204.

The pMOS transistor 1226 has a gate coupled to a shared drain (PULSE_B) of the current comparator's nMOS transistor 1216 and pMOS transistor 1214, and functions as a set b input of the voltage-glitch-protected latch 1204, that upon glitch detection sets PULSE_LATCHED_NEG to "1" (or to VDD), similar to the non-inverting Glitch-Det-Pulse input to the nMOS transistor 714 of the voltage-glitch-protected latch 700 in FIG. 7. The negative domain supply 1213 ($V_{Neg\text{-}Trigger}$) to the voltage-glitch-detector 1202 and the negative domain supply ($V_{Neg\text{-}Latch}$) to the voltage-glitch-isolated latch 1204 both function as isolated ground or negative domain supplies to the voltage-glitch-detector and the voltage-glitch-isolated latch, respectively, during a voltage-glitch. The isolated ground supplies ($V_{NEG\text{-}Trigger}$ and $V_{NEG\text{-}Latch}$) will cause the ground of the voltage-glitch detector 1202 and voltage-glitch-isolated latch 1204 to ramp down to negative voltages at similar or slightly lower rate than a ramp down rate of a voltage-glitch on the VDD supply. Thus, isolated ground supplies ($V_{NEG\text{-}Trigger}$ and $V_{NEG\text{-}Latch}$) will keep the voltage-glitch detector 1202 and voltage-glitch-isolated latch 1204 functional in at least a first 20 ns of the voltage-glitch. The ground isolation is achieved using the drain to source resistance ($R_{DS}$) of the nMOS transistors 1212, 1232, with both a source and an N-well or body contact coupled to the $V_{NEG(Trigger/Latch)}$ supplies.

During a voltage-glitch both nMOS transistors 1212, 1232, initially act as resistor elements having a large enough resistance ($R_{DS}$) during the first 20 ns of a voltage-glitch, and later act to fully isolate the internal $V_{NEG(Trigger/Latch)}$ nodes. The nMOS transistors 1212, 1232, act as a sample-and-hold switch by disconnecting both $V_{NEG\ (Trigger/Latch)}$ supplies from ground upon a negative edge of the PULSE_LATCHED_NEG_B internal node of the SR latch 1204.

The $V_{REF}$ circuit 1208 of the voltage-glitch detector 1202 utilizes the voltage-mirroring technique previously described in connection with FIG. 8 to enable the $V_{REF}$ circuit to generate $I_{VOLTAGE\text{-}GLITCH}$ in 1208. In particular, the VREF Trimmed glitch voltage ($V_{GLITCH}$) to nMOS transistor 1218 results in a drain-to-source ($I_{DS}$) in the nMOS transistor 1218 which forces an $I_{DS}$ of nMOS transistor 1220 to that of nMOS transistor 1218. This causes gate-to-source voltage ($V_{GS}$) of nMOS transistor 1220 to substantially equal the $V_{GS\text{-}1218}$ of nMOS transistor 1218, which is substantially equal to the glitch voltage ($V_{GLITCH}$). This voltage is then mirrored to pMOS transistor 1222 so that a $V_{GS\text{-}1222}$ is substantially equal to the glitch voltage ($V_{GLITCH}$), which results in a drain-to-source current ($I_{DS}$) of pMOS transistor 1222 substantially equal to $I_{VOLTAGE\text{-}GLITCH}$. The drain-to-source current ($I_{DS}$) of pMOS transistor 1222 is then forced on nMOS transistor 1224, which created an nBIAS voltage which is the VREF input of the current comparator 1206 of the voltage-glitch detector 1202.

The reference voltage (VREF) nMOS transistor 1224 is isolated by the $V_{REF}$ voltage-glitch-isolation filter 1210, and coupled to the $V_{REF\text{-}RC}$ gate of nMOS transistor 1216, which pulls down $I_{GLITCH}$ against a pull-up current of $I_{VDD}$ from the pMOS transistor 1214, similar to the current-comparator 602 in FIG. 6, when $I_{GLITCH} > I_{VDD}$. In the current-comparator 602 of FIG. 6, the current-comparator generates a voltage-glitch detection pulse with a rising edge pulse. In the circuit of FIG. 12, capable of operating in a negative domain the current-comparator 1206 generates a voltage-glitch detection pulse with a falling edge pulse. This pulse is latched by the voltage-glitch-isolated latch 1204 and is delivered as a positive edge PULSE_LATCHED to the RESET output of the voltage-glitch isolated latch. Similarly to the voltage-glitch-isolated latch shown in FIG. 7, the isolated supply of the latch ($V_{Neg\text{-}Latch}$) is sampled and held at the time of generating voltage-glitch-detection-pulse-latched using the negative edge of the internal signal PULSE_LATCHED_NEG_B signal. However, the voltage level of the isolated ground in this circuit is negative, and will maintain a voltage relative to the VDD supply for a time sufficient to enable a "0" voltage level of PULSE_LATCHED_NEG_B internal signal which subsequently enables "1" at the PULSE_LATCHED output of the latch 1204 for a long enough time to force a system reset when the voltage-glitch ends. The latch output PULSE_LATCHED is coupled to an alternative first CMOS Level Detector (414a in FIG. 4) shown in FIG. 13B with a negative reset input to be able to cause the PU/PD controller 402 to reset, and the PULSE_LATCHED_NEG output of the latch 1204 and a VNEG output of the glitch-detector 1202 are coupled to a matching inputs in the alternative CMOS-Level Detector in FIG. 13B, respectively. The VNEG output is requires since the PULSE_LATCHED_NEG is generated by a VNEG domain and is relative to VNEG and not to ground.

Figure 13A:
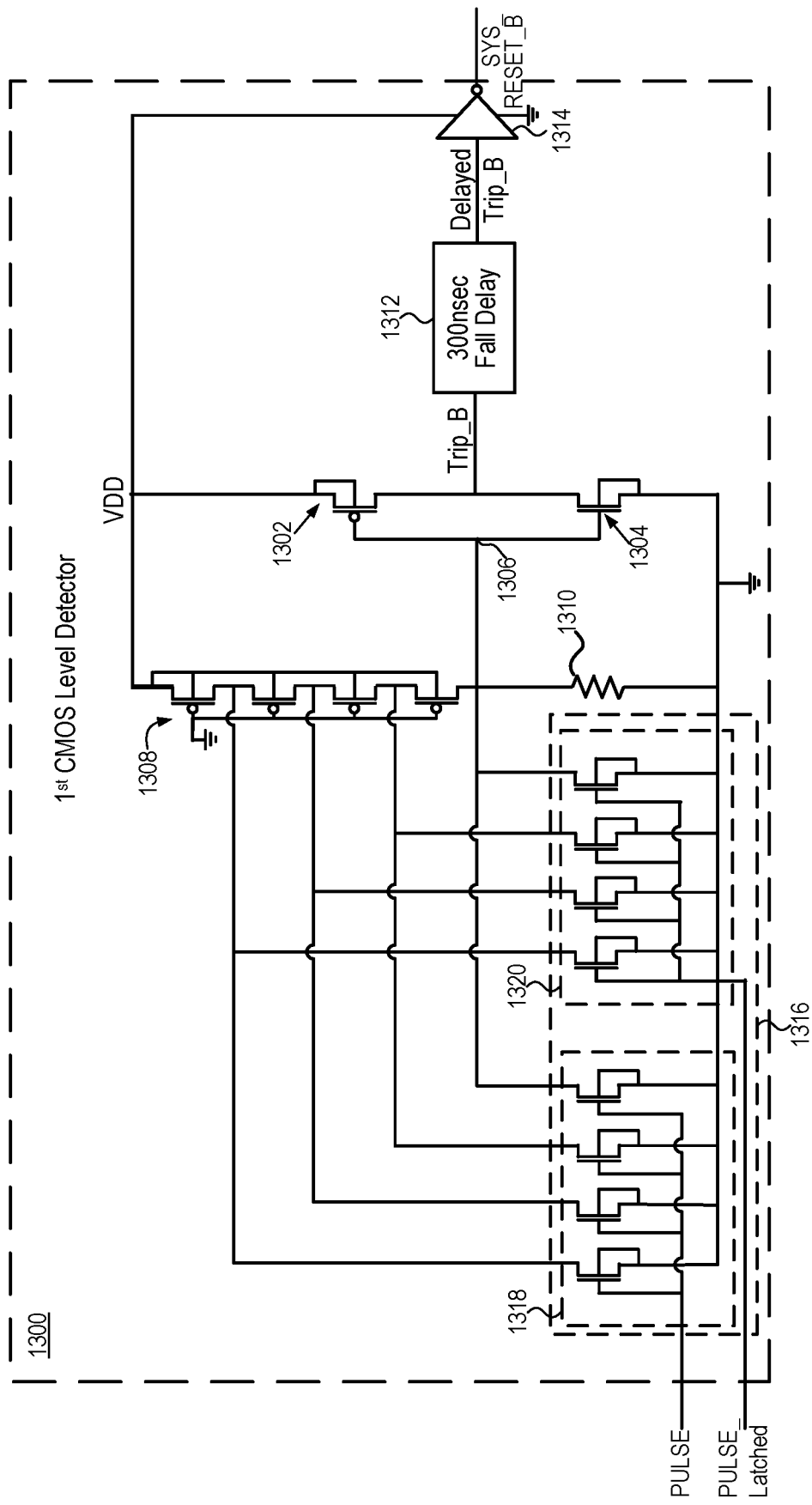
FIGS. 13A and 13B are schematic diagram illustrating embodiments of a system reset block including a retention-circuit to recall a voltage-glitch was detected when power is restored to the system reset block.
Figure 13B:
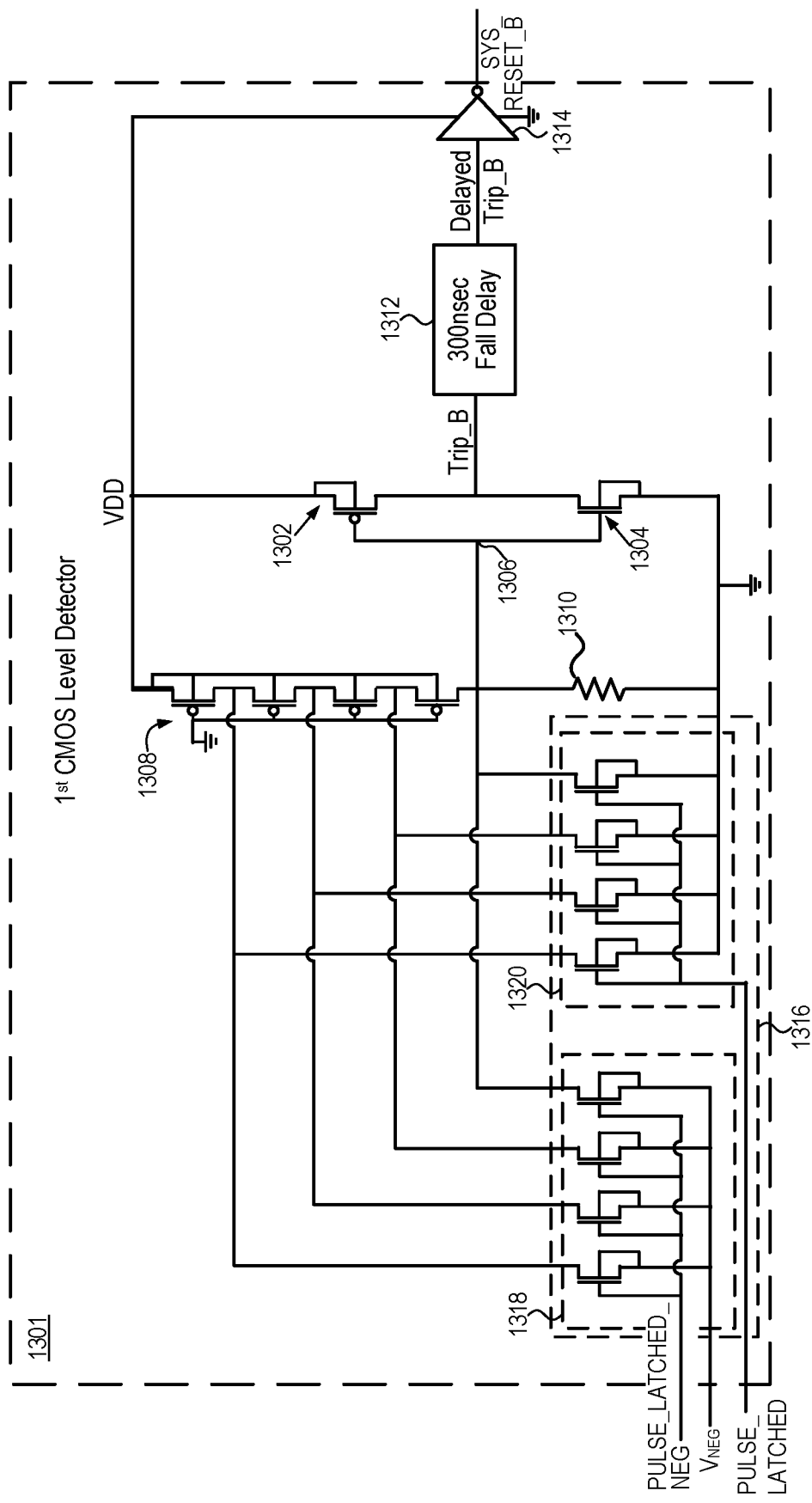

In another embodiment, shown in FIGS. 13A and 13B, at least a $1^{st}$ CMOS level-detector in the system reset block includes a retention-circuit to recall a voltage-glitch was detected when power is restored to the system reset block, thereby ensuring a full and safe system or chip reset even when power is lost to the voltage-glitch detection and protection circuit. Referring to FIG. 13A the CMOS level-detector 1300 includes an inverter constructed from a strong pMOS transistor 1302 and a weak nMOS transistor 1304 connected in series between the main voltage supply (VDD) and ground, and a trip-node 1306 formed between gates of the pMOS and nMOS transistors. In normal operation, that is operations with a steady main voltage supply above $VDD_{MIN}$, the trip-node 1306 is biased by a RC divider formed by a number of weak pMOS transistors (collectively 1308) and a resistor 1310 connected in series between VDD and ground. The resistance of the resistor 1310 is selected to be relatively large, on the order of about 5 MΩ, to avoid excessive current flow and power consumption by the CMOS level-detector 1300 during normal operation, i.e., prior to a power down event, either a voltage-glitch or a slow drop in VDD.

During normal operation, the trip-node 1306 is at a high voltage or logic 1 and a logic complement (Trip_B) is coupled through a delay circuit 1312 and an inverter 1314 to provide logic high or 1 to a SYS_RESET_B output of the CMOS level-detector 1300. During a CMOS level reset event, that is reset caused by a slow, relatively long drop in the supply voltage, the trip-node 1306 is slowly discharged towards ground (a logic 0) through the resistor 1310. When the trip-node 1306 is sufficiently discharged the strong pMOS transistor 1302 is turned on and the weak nMOS transistor 1304 turned off, flipping the logic complement (Trip_B) to a logic 1 and, after a delay by the delay circuit 1312 the CMOS level-detector 1300 outputs a SYS_RESET_B signal (logic 0) which causes the PU/PD controller (not shown in this figure) to initiate a reset sequence when the supply voltage is restored to a level above a predefined reset voltage.

During a voltage-glitch event a voltage-glitch detection pulse (PULSE) is received in the CMOS level-detector 1300 that causes the trip-node 1306 to be quickly discharged to the trip set point (logic 0), flipping the logic complement (Trip_B) to a logic 1 and, after a delay by the delay circuit 1312 the CMOS level-detector 1300 outputs a logic 0 SYS_RESET_B signal causing the PU/PD controller to initiate a full system reset. In some embodiments, the voltage-glitch detection and protection circuit further includes a voltage-glitch-protected latch and a voltage-glitch PULSE_Latched (PULSE_LATCHED) signal is also received in the CMOS level-detector 1300.

The CMOS level-detector 1300 further includes a kind of retention-circuit 1316 to enable the storing and recall of a voltage-glitch event following loss of power to the CMOS level-detector upon restoration of power. In the embodiment shown in FIG. 13A the retention-circuit 1316 includes a pair of pull-down circuits, each including a number of nMOS transistors coupled in parallel between source/drain (S/D) junctions of the weak pMOS transistors 1308 and ground so that a PULSE coupled to the gates of the nMOS transistors in a first pull-down circuit 1318 and/or a PULSE_LATCHED signal coupled to the gates of the nMOS transistors in a second pull-down circuit 1320 will cause the weak pMOS transistors 1308 to turn on, quickly discharging the trip-node 1306 and causing the CMOS level-detector 1300 to output a SYS_RESET_B signal resulting in the PU/PD controller initiating a full system reset. It is noted that because trip-node 1306 will normally be at discharged state if given enough time at a lower enough supply voltage, and the transistors of the pull-down circuits 1318, 1320, are nMOS, causing trip-node 1306 to discharge to fast "0", once turned on by the PULSE or PULSE_LATCHED signal, the trip-node 1306 will remain discharged when power is restored to the CMOS level-detector 1300, thereby remembering or recalling that a voltage-glitch event has been detected, and signaling the PU/PD controller to perform the full system reset ensuring a secure chip or device is protected from a side channel voltage-glitch attack or side channel attack (SCA). This is in addition to the fact that PULSE_LATCHED stays on in a high enough CMOS level "1" state to force trip-node 1306 to "0" for a long enough time to enable the trip-node to natively stay at "0" even if the PULSE_LATCHED is degraded to below "1" CMOS Level. Finally, the retention-circuit 1316 can be reset by SYS_RESET_B that eventually forces both PULSE and PULSE_LATCHED inputs to the gates of the nMOS transistors to "0", causing weak pMOS transistors 1308 to be able to restore the CMOS level-detector 1300 to the same nominal trip-point.

FIG. 13B illustrates another embodiment of a CMOS level-detector including a retention-circuit, and configured for use with a negative-domain glitch-detector, such as shown and described with respect to FIG. 12 above. Referring to FIG. 13B it is noted that the CMOS level-detector 1301 is substantially the same as the circuit of FIG. 13A, but the CMOS level-detector 1301 receives PULSE_LATCHED-NEG, $V_{NEG}$ and PULSE-LATCHED from the negative-domain glitch-detector FIG. 12, and transistors of the pull-down circuits 1318 are coupled to $V_{NEG}$ rather than to ground.

Figure 14:
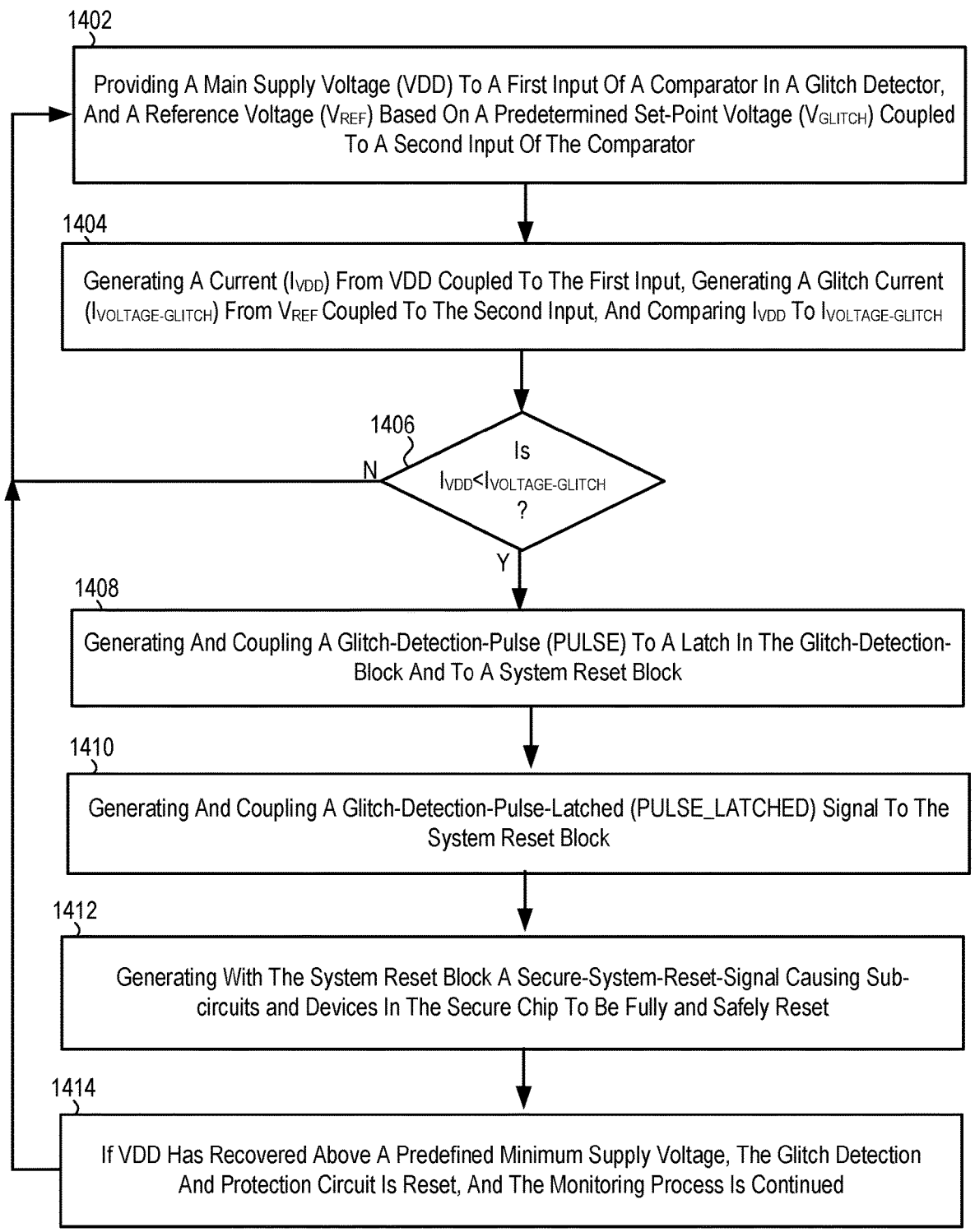
FIG. 14 is a flowchart illustrating a method of operating a voltage-glitch detection and protection circuit to detect and protect against a side channel voltage-glitch attack (SCA)

A method of operating a voltage-glitch detection and protection circuit including voltage-glitch protection system with a voltage-glitch-detection block including a voltage-glitch-detector and a voltage-glitch-protected latch to detect and protect against a side channel voltage-glitch attack (SCA) in a secure chip or system will now described with reference to the flowchart FIG. 14. Referring to FIG. 14, the method begins with providing a main supply voltage (VDD) to a first input of a current-comparator in a glitch detector, and a reference voltage ($V_{REF}$) based on a predetermined set-point voltage ($V_{GLITCH}$) coupled to a second input of the comparator (step 1402). Next, a current ($I_{VDD}$) is generated from the VDD coupled to the first input, glitch current ($I_{VOLTAGE-GLITCH}$) is generated from $V_{REF}$, and $I_{VDD}$ is compared to $I_{VOLTAGE-GLITCH}$ (step 1404). A determination is made as whether $I_{VDD}$ is less than $I_{VOLTAGE-GLITCH}$ (step 1406).

If $I_{VDD}$ is not less than $I_{VOLTAGE-GLITCH}$ then steps 1402 and 1404 are repeated as the circuit continues to monitor the supply voltage (VDD) for a voltage-glitch. It is important to note that the circuit also continues to simultaneously or concurrently monitor for other events in the chip voltage supply (VDD), such as those generating a slow clock signal, a brown-out-detector (BOD) reset and/or a CMOS level reset, without interference or otherwise adverse impact from the voltage-glitch-detection block.

If $I_{VDD}$ is less than $I_{VOLTAGE-GLITCH}$, a glitch-detection-pulse (PULSE) is generated and coupled to a latch in the glitch-detection-block and to a system reset block (step 1408). A glitch-detection-pulse-latched (PULSE_LATCHED) signal is then generated and coupled to the system reset block (step 1410). As explained above, the PULSE_LATCHED signal ensures a system reset signal (SYS_RESET_B) is generated and sent to the PU/PD controller to cause the controller to execute a full reset of the secure chip even if power to the comparator is subsequently lost. More preferably, the method includes sampling and holding the isolated supply voltage ($VDD_{RC\_S\&H}$) to the voltage-glitch-protected latch at the time generating the PULSE_LATCHED signal.

Next, in response to either or both of the PULSE and the PULSE_LATCHED signal a system reset signal (SYS_RESET_B) is generated in the system reset block and coupled to a power-up/power-down (PU/PD) controller to cause sub-circuits and devices in the chip to be fully and safely reset (step 1412).

Finally, it is determined whether VDD has recovered above a predetermined minimum supply voltage ($VDD_{MIN}$), and if VDD has recovered, the voltage-glitch detection and protection circuit is reset, and the monitoring process is continued (step 1414).

Figure 15:
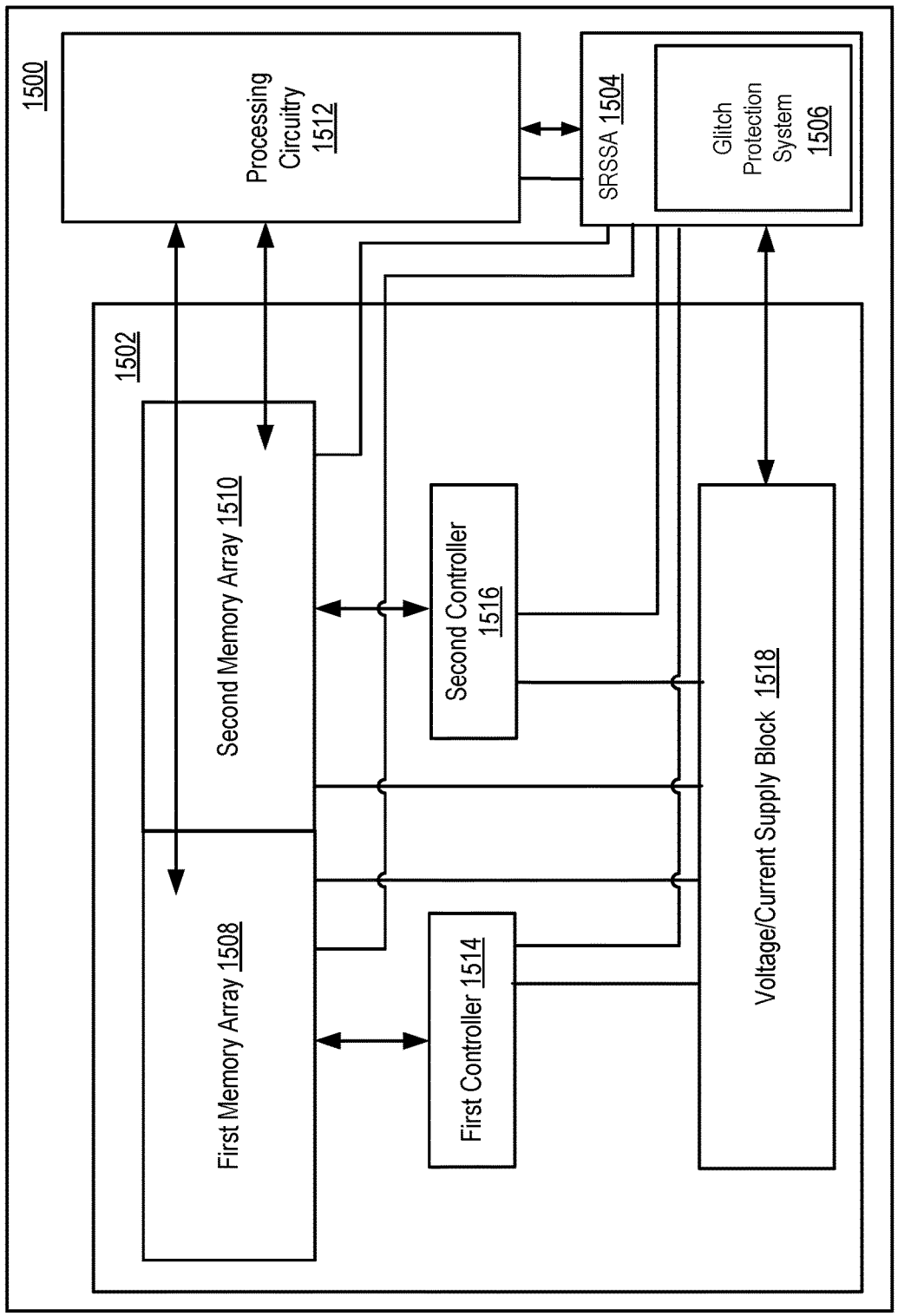
FIG. 15 is a block diagram of an embedded non-volatile memory (eNVM) system including a System Reset Sub System Analog (SRSSA) block with a voltage-glitch detection and protection circuit including a voltage-glitch-detector to protect against a SCA.

FIG. 15 is a block diagram of a secure system or chip 1500 including an embedded non-volatile memory (eNVM) or flash memory 1502, and a System Reset Sub-System Analog (SRSSA) block 1504 including a voltage-glitch protection system 1506 for protection against side channel voltage-glitch attacks (SCAs). Referring to FIG. 15 the flash memory 1502 includes a number of memory arrays, such as a first memory array 1508 and a second memory array 1510, each including an array of non-volatile memory cells, and each controlled by processing circuitry 1512 integrally formed on the secure chip 1500. Generally, the flash memory 1502 further includes first and second controllers 1514, 1516, which are each configured to provide support for read operations as well as program and erase operations for the first and second memory arrays 1508, 1510, respectively, and a voltage/current supply block 1518. The voltage/current supply block 1518 is a multi-purpose mixed-signal block configured to provide flash memory 1502 with a range of voltages, currents, and digital signals/indicators that are utilized for the different modes of operation listed above.

The SRSSA block 1504 includes an embodiment of the voltage-glitch protection system 1506, such as one of those described above, and is coupled to the processing circuitry 1512 and to each block or circuit of the flash memory 1502 and configured to provide global-reset-signals to each block or circuit to execute a POR reset scheme that is substantially the same regardless of the event causing reset. The voltage-glitch protection system 1506 ensures a safe reset will be executed under all conditions of supply ramps and levels, defending the secure chip 1500 against any and all side channel voltage-glitch attacks without impacting performance of the secure chip or the flash memory 1502.

It will further be appreciated that components of SRSSA block 1504, including the voltage-glitch protection system 1506, may be implemented on a same secure chip 1500 with the flash memory 1502 and processing circuitry 1512, or on a separate chip coupled to the secure chip and configured to monitor the main voltage supply (VDD) to the flash memory and processing circuitry, and configured to provide global-reset-signals thereto.

Thus, a voltage-glitch protection system capable of detecting and protecting against rapid and short duration side channel voltage-glitch attacks on a supply voltage (VDD) down to 0V or negative voltages, and lasting from 25 µs to less than about 20 ns, and methods for operating the same have been disclosed. Embodiments of the present invention have been described above with the aid of functional and schematic block diagrams illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

It is to be understood that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The breadth and scope of the present invention should not be limited by any of the above-described exemplary embodiments, but should be defined only in accordance with the following claims and their equivalents.

What is claimed is:

1. A circuit comprising:
   a voltage-glitch-detection-block including:
      a voltage-glitch-detector operable to detect a voltage-glitch in a supply voltage (VDD) and generate a voltage-glitch-detection-pulse (PULSE); and
      a first latch having a set input coupled to the voltage-glitch-detector, the first latch operable to receive the PULSE and generate a first voltage-glitch-detection-pulse-latched (first PULSE_LATCHED) signal; and
   a system reset block coupled the voltage-glitch-detector and the first latch to receive the PULSE and the first PULSE_LATCHED signal, and to generate a secure system reset signal that causes a number of on-chip-circuits in a chip including the circuit to be reset,
   wherein the voltage-glitch-detector comprises:
      a comparator having a first input coupled to VDD and a second input coupled to a reference voltage ($V_{REF}$) based on a predetermined set-point voltage ($V_{GLITCH}$), the comparator operable to compare VDD to $V_{REF}$, and wherein the voltage-glitch-detector is operable to generate the PULSE when VDD<$V_{REF}$; and a first voltage-glitch-isolation filter (GIF) through which the comparator is coupled to VDD to provide a filtered voltage (VDD$_{RC}$) to the comparator to isolate the comparator from a rapid decrease in VDD due to the voltage-glitch, and a second GIF through which the second input is coupled to V$_{REF}$ to isolate the comparator from a rapid change in V$_{REF}$ due to the voltage-glitch.

2. The circuit of claim 1 wherein the comparator is a current-comparator comprising a current-source operable to generate a voltage-glitch-current (I$_{VOLTAGE-GLITCH}$) based on V$_{REF}$, and wherein the current-comparator is operable to compare I$_{VOLTAGE-GLITCH}$ to a current (I$_{VDD}$) from VDD applied to the first input to V$_{REF}$, and to generate the PULSE when I$_{VDD}$<I$_{VOLTAGE-GLITCH}$.

3. The circuit of claim 2 wherein the first latch is a voltage-glitch-protected-latch comprising a third GIF and a sample and hold (S&H) circuit through which the voltage-glitch-protected-latch is coupled to VDD to provide a voltage (VDD$_{RC\_S\&H}$) to power the voltage-glitch-protected-latch, and the first PULSE_LATCHED signal is coupled to the system reset block when VDD drops below V$_{GLITCH}$.

4. The circuit of claim 1 wherein the voltage-glitch-detection-block further comprises reference voltage generator including a voltage-adder to generate V$_{REF}$ using a voltage-mirroring technique.

5. The circuit of claim 1 wherein the voltage-glitch-detection-block further comprises a reference voltage generator including a folding current-mirror with at least two-stages to generate V$_{REF}$.

6. The circuit of claim 1 wherein the system reset block comprises a first level-detector coupled to receive the PULSE and the first PULSE_LATCHED signal, the first level-detector operable to generate the secure system reset signal.

7. A circuit comprising:
a voltage-glitch-detection-block including:
a voltage-glitch-detector operable to detect a voltage-glitch in a supply voltage (VDD) and generate a voltage-glitch-detection-pulse (PULSE); and
a first latch having a set input coupled to the voltage-glitch-detector, the first latch operable to receive the PULSE and generate a first voltage-glitch-detection-pulse-latched (first PULSE_LATCHED) signal; and
a system reset block coupled the voltage-glitch-detector and the first latch to receive the PULSE and the first PULSE_LATCHED signal, and to generate a secure system reset signal that causes a number of on-chip-circuits in a chip including the circuit to be reset,
wherein the system reset block comprises a first level-detector coupled to receive the PULSE and the first PULSE_LATCHED signal, the first level-detector operable to generate the secure system reset signal, and
wherein the system reset block further comprises a second level-detector coupled to VDD, and, through a logic gate, to a controller, wherein:
the second level-detector is operable to detect a drop in VDD below a predetermined minimum supply voltage (VDD$_{MIN}$) and generate a non-secure system reset signal;
the logic gate is operable to receive non-secure system reset signal from the second level-detector and the secure system reset signal from the first level-detector generate a system-reset-signal to the controller; and
the controller is operable to generate one or more global-reset-signals to reset the number of on-chip-circuits in the chip.

8. The circuit of claim 7 wherein the first latch further comprise a reset_b input coupled to an output of the logic gate.

9. The circuit of claim 7 wherein the voltage-glitch-detection-block further comprises a second latch having a set input coupled to the voltage-glitch-detector, the second latch operable to receive the PULSE from the voltage-glitch-detector, generate a second PULSE_LATCHED signal, and couple the second PULSE_LATCHED signal to design-for-testability logic in the circuit.

10. The circuit of claim 9 wherein second latch comprises a reset-b input coupled to receive the non-secure system reset signal from the second level-detector.

11. The circuit of claim 1 wherein the voltage-glitch-detector and first latch are operable to operate in a negative voltage domain during the voltage-glitch.

12. A system comprising:
an embedded non-volatile memory;
a circuit comprising:
a voltage-glitch-detection-block including:
a voltage-glitch-detector operable to detect a voltage-glitch in a supply voltage (VDD) and generate a voltage-glitch-detection-pulse (PULSE); and
a latch having a set input coupled to the voltage-glitch-detector, the
latch operable to receive the PULSE and generate a voltage-glitch-detection-pulse-latched (PULSE_LATCHED) signal; and
a system reset block coupled the voltage-glitch-detector and the latch to receive the PULSE and the PULSE_LATCHED signal, and to generate a secure system reset signal to reset the embedded non-volatile memory, the system reset block comprising:
a first level-detector coupled to receive the PULSE and the PULSE_LATCHED signal, the first level-detector operable to generate the secure system reset signal; and
a second level-detector coupled to VDD, and, through a logic gate, to a controller, wherein the second level-detector is operable to detect a drop in VDD below a predetermined minimum supply voltage (VDDMIN) and generate a non-secure system reset signal;
wherein the voltage-glitch-detector comprises a comparator having a first input coupled to VDD and a second input coupled to a reference voltage (V$_{REF}$) based on a predetermined setpoint voltage (V$_{GLITCH}$), the comparator operable to compare VDD to V$_{REF}$, and wherein the voltage-glitch-detector is operable to generate the PULSE when VDD<V$_{REF}$, and
wherein the latch is a voltage-glitch-protected-latch comprising a first voltage-glitch-isolation filter (GIF) and a sample and hold (S&H) circuit through which the voltage-glitch-protected-latch is coupled to VDD to provide a voltage (VDD$_{RC\_S\&H}$) to power the voltage-glitch-protected-latch when VDD drops below V$_{GLITCH}$.

13. The system of claim 12 wherein the comparator is a current-comparator comprising a current-source operable to generate a voltage-glitch-current (I$_{VOLTAGE-GLITCH}$) based on V$_{REF}$, and wherein the current-comparator is operable to compare I$_{VOLTAGE-GLITCH}$ to a current (I$_{VDD}$) generated from VDD and to generate the PULSE when I$_{VDD}$<I$_{VOLTAGE-GLITCH}$.

14. The system of claim 13 wherein the voltage-glitch-detection-block further comprises a second GIF through which the comparator is coupled to VDD to provide a filtered voltage ($VDD_{RC}$) to the comparator to isolate the comparator from a rapid decrease in VDD due to the voltage-glitch, and a third GIF through which the second input is coupled to VREF to isolate the comparator from a rapid change in $V_{REF}$ due to the voltage-glitch.

15. The system of claim 12 wherein the system reset block comprises:
   the logic gate is operable to receive non-secure system reset signal from the second level-detector and the secure system reset signal from the first level-detector generate a system-reset-signal to the controller; and
   the controller is operable to generate the secure system reset signal to reset the embedded non-volatile memory.

* * * * *